(12) United States Patent
Liao et al.

(10) Patent No.: US 9,628,192 B2
(45) Date of Patent: Apr. 18, 2017

(54) OPTICAL TRANSMITTER, WAVELENGTH ALIGNMENT METHOD, AND PASSIVE OPTICAL NETWORK SYSTEM

(71) Applicant: Huawei Technologies Co., Ltd., Shenzhen, Guangdong (CN)

(72) Inventors: Zhenxing Liao, Wuhan (CN); Lingjie Wang, Wuhan (CN); Min Zhou, Shenzhen (CN); Jing Huang, Wuhan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/924,344

(22) Filed: Oct. 27, 2015

(65) Prior Publication Data
US 2016/0127038 A1 May 5, 2016

(30) Foreign Application Priority Data

Oct. 30, 2014 (CN) .......................... 2014 1 0603572

(51) Int. Cl.
*H04B 10/572* (2013.01)
*H01S 5/00* (2006.01)

(52) U.S. Cl.
CPC .............. *H04B 10/572* (2013.01); *H01S 5/00* (2013.01)

(58) Field of Classification Search
CPC .................................................. H04B 10/572
See application file for complete search history.

(56) References Cited

U.S. PATENT DOCUMENTS

| 5,068,865 A | * | 11/1991 | Ohshima | ............... G02B 6/4207 |
| | | | | 372/36 |
| 6,094,446 A | * | 7/2000 | Tei | ......................... H01S 5/0687 |
| | | | | 372/32 |

(Continued)

FOREIGN PATENT DOCUMENTS

| CN | 101098238 A | 1/2008 |
| CN | 101296186 A | 10/2008 |

(Continued)

OTHER PUBLICATIONS

Daniel Mahgerefteh, et al., "Chirp Managed Laser and Applications", IEEE Journal of Selected Topics in Quantum Electronics, vol. 16, No. 5, Sep./Oct. 2010, p. 1126-1139.

(Continued)

*Primary Examiner* — Shi K Li

(57) ABSTRACT

Embodiments of the present invention disclose an optical transmitter, a 10 G-DML, an MPD 1, an MPD 2, a collimation lens, and a narrowband optical filter are disposed in a TO to achieve monitoring of an optical power, received optical powers are monitored by using the MPD 1 and the MPD 2, the detected optical powers are output to a wavelength locking monitoring circuit by using a TO pin, variations, which are detected by the wavelength locking monitoring circuit, of the optical power and a variation of a wavelength locking factor K0 are separately compared with corresponding thresholds, and a comparison result are sent to a wavelength locking control circuit, to enable the wavelength locking control circuit to adjust, according to the comparison result and by using the TO pin, a temperature of a TEC to perform wavelength alignment.

17 Claims, 8 Drawing Sheets

(56) References Cited

U.S. PATENT DOCUMENTS

| 6,937,628 B2 | 8/2005 | Tatsuno et al. |
|---|---|---|
| 2005/0013614 A1 | 1/2005 | Ota et al. |
| 2009/0003327 A1 | 1/2009 | Zang et al. |
| 2009/0097863 A1* | 4/2009 | Oomori ............... H04B 10/508 398/186 |
| 2012/0189306 A1 | 7/2012 | Du et al. |

FOREIGN PATENT DOCUMENTS

| CN | 102315892 A | 1/2012 |
|---|---|---|
| CN | 202886658 U | 4/2013 |
| CN | 103261935 A | 8/2013 |
| CN | 103269285 A | 8/2013 |
| CN | 103281129 A | 9/2013 |
| WO | WO 2005/084268 A2 | 9/2005 |
| WO | WO 2010/040377 A1 | 4/2010 |

OTHER PUBLICATIONS

P. Bernasconi, et al., "Design and Challenges in a 100 Gb/s Hybrid-Integrated Photonic Circuit", ECOC Technical Digest, 2012, 3 pages.

* cited by examiner

US 9,628,192 B2

OPTICAL TRANSMITTER, WAVELENGTH ALIGNMENT METHOD, AND PASSIVE OPTICAL NETWORK SYSTEM

CROSS-REFERENCE TO RELATED APPLICATIONS

This application claims priority to Chinese Patent Application No. 201410603572.9, filed on Oct. 30, 2014, which is hereby incorporated by reference in its entirety.

TECHNICAL FIELD

The present invention relates to the field of optical fiber communications, and in particular, to an optical transmitter, a wavelength alignment method, and a passive optical network system.

BACKGROUND

Based on increasing requirements of users on bandwidth, a PON (Passive Optical Network) system, which is extremely competitive, of an optical fiber access network that is used as a new generation broadband access network becomes an object mainly used by the users. Generally, the PON system includes one OLT (Optical Line Terminal, optical line terminal) located in a central office, one ODN (Optical Distribution Network, optical distribution network) used for bifurcation/coupling or multiplexing/demultiplexing, and a plurality of ONUs (Optical Network Unit, optical network unit).

However, with increasingly faster development of various broadband services, such as a video conference, a 3D television, mobile backhaul, an interactive game, and a cloud service, a line rate in the PON system also needs to be improved constantly. In particular, the existing EPON system and GPON system need to be gradually upgraded to high-speed (a speed of 10 G or above) PON systems. However, for a PON system of a high modulation rate of 10 G or above, an obvious dispersion penalty is caused even within a transmission distance of 20 km, causing that quality of a transmit signal is seriously degraded and system receiving sensitivity is seriously reduced. A dispersion penalty of transmission is closely related to a transmission and modulation manner of the PON system, different modulation schemes cause different frequency chirps of an optical signal, and this directly causes different introduced dispersion penalties. Currently, an OLT-side optical module of a PON system of 10 G high-rate modulation mainly uses: a transmission and external modulation manner of an EML (Electro-absorption Modulated Laser) and a transmission and direct modulation manner of a DML (Directly Modulated Laser, directly modulated laser).

The transmission and external modulation manner of the EML refers to that: an output light of a laser is directly injected into an external modulator, a modulation signal controls the external modulator, and an acousto-optic effect and an electro-optic effect are used to enable a parameter, such as intensity of output light of the external modulator, to change with the signal. Because the laser works in a static direct current state, an output signal has a small frequency chirp and high transmission performance. Therefore, at the present stage, 10 G PON OLT-side optical modules all use a transmission manner of an EML (Electro-absorption Modulated Laser, electro-absorption modulator). However, a cost of the EML is high, and an insertion loss is greater (6 dB to 8 dB), causing that transmission power consumption remains at a high level.

The transmission and direct modulation manner of the DML refers to modulating output of a semiconductor laser by changing an injected current, a structure of the DML is simple and is easy to implement, and a cost is low. However, a modulation current causes a change in an active layer refractive index, causing that a phase of a light is modulated, and therefore, an operating frequency is broadened, that is, a relatively great frequency chirp exists, and with increase of a modulation rate, a chirp phenomenon becomes more serious. Therefore, it is difficult to directly use the traditional DML as a transmitter of a high-speed OLT optical module of 10 G or above.

Therefore, an optical transmitter with a high modulation rate that is based on a DML technology, has a low cost, consumes less power, and can reduce the chirp phenomenon is urgently needed, so as to resolve engineering problems currently facing the 10 G-PON and facing a higher-rate PON system in the future.

SUMMARY

In view of this, embodiments of the present invention provide an optical transmitter, a wavelength alignment method, and a passive optical network system, so as to resolve a problem of serious chirp phenomenon that is caused because in the prior art a DML cannot adapt to a 10 G-PON and a transmitter of a higher-rate PON system.

To achieve the foregoing objective, the present invention provides the following technical solutions:

A first aspect of the embodiments of the present invention provides an optical transmitter, including: a laser transmitter TO base, a thermoelectric cooler TEC, and a heat sink that are transverse and are connected sequentially from bottom to top;

a second monitor photodiode MPD, a 10 G-directly modulated laser DML, a collimation lens, and a narrowband optical filter that are disposed above the heat sink, where the second MPD and the collimation lens are located at two sides of the 10 G-DML, and the narrowband optical filter is located at the other side of the collimation lens, and one side, which faces the collimation lens, of the narrowband optical filter is connected to the heat sink at a preset tilt angle;

a first monitor photodiode MPD disposed above the narrowband optical filter; and a wavelength locking monitoring circuit connected to a TO pin disposed at one side of the TO base, and a wavelength locking control circuit connected to the wavelength locking monitoring circuit, where a forward emitted light emitted by the 10 G-DML is input to the narrowband optical filter through the collimation lens, and a backward emitted light emitted by the 10 G-DML is input to the second MPD; and the narrowband optical filter splits the forward emitted light into a forward transmitted light and a backward reflected light, transmits, at a preset elevation angle, the backward reflected light to the second MPD, and partially reflects the forward transmitted light to the first MPD connected to the narrowband optical filter;

the first MPD receives and monitors a first optical power of the forward transmitted light, and the second MPD receives and monitors a second optical power that is after the backward emitted light and the backward reflected light complement each other; and the wavelength locking monitoring circuit that receives the first optical power and the second optical power by using the TO pin separately compares detected variations of the first optical power and the second optical power and a variation of a wavelength locking factor K0 with corresponding thresholds, and sends a comparison result to the wavelength locking control circuit, to enable the wavelength locking control circuit to adjust, according to the comparison result and by using the TO pin, a temperature of the TEC to perform wavelength alignment, where the wavelength locking factor K0 is a ratio of the first optical power to the second optical power or a difference between the first optical power and the second optical power.

In a first implementation manner of the first aspect of the embodiments of the present invention, the wavelength locking monitoring circuit that separately compares detected variations of the first optical power and the second optical power and a variation of a wavelength locking factor K0 with corresponding thresholds, and sends a comparison result to the wavelength locking control circuit includes: when the variations of the first optical power and the second optical power and the variation of the wavelength locking factor K0 exceed the corresponding thresholds, comparing the first optical power with a first optical power detected last time, and comparing the second optical power with a second optical power detected last time, and if the first optical power is less than the first optical power detected last time, and the second optical power is greater than the second optical power detected last time, obtaining a first comparison result, and sending the first comparison result to the wavelength locking control circuit; otherwise, obtaining a second comparison result, and sending the second comparison result to the wavelength locking control circuit, where the first comparison result is that wavelengths of the forward emitted light and the backward emitted light that are emitted by the 10 G-DML drift towards a longer wave; and the second comparison result is that wavelengths of the forward emitted light and the backward emitted light that are emitted by the 10 G-DML drift towards a shorter wave.

In the first implementation manner of the first aspect of the embodiments of the present invention, the wavelength locking control circuit that adjusts, according to the comparison result and by using the TO pin, a temperature of the TEC to perform wavelength alignment includes: when the first comparison result is received, sending, by using the TO pin, an instruction for reducing the temperature of the thermoelectric cooler TEC, and controlling a wavelength of the 10 G-DML to be aligned with the wavelength locking factor K0; or when the second comparison result is received, sending, by using the TO pin, an instruction for increasing the temperature of the TEC, and controlling a wavelength of the 10 G-DML to be aligned with the wavelength locking factor K0.

A second aspect of the embodiments of the present invention provides a wavelength alignment method, applied to the foregoing optical transmitter disclosed in the first aspect of the embodiments of the present invention, where the method includes:

receiving, by a wavelength locking monitoring circuit by using a TO pin, a first optical power, which is monitored by a first MPD, of a forward transmitted light, and a second optical power that is monitored by a second MPD and that is after a backward emitted light and a backward reflected light complement each other, and using a ratio of the first optical power to the second optical power or a difference between the first optical power and the second optical power as a wavelength locking factor K0;

monitoring, by the wavelength locking monitoring circuit, whether variations of the first optical power and second optical power and a variation of the wavelength locking factor K0 exceed corresponding thresholds; and when the variations of the first optical power and the second optical power and the variation of the wavelength locking factor K0 exceed the corresponding thresholds, comparing the first optical power with a first optical power detected last time, comparing the second optical power with a second optical power detected last time, and sending a comparison result to the wavelength locking control circuit, to enable the wavelength locking control circuit to adjust, according to the comparison result and by using the TO pin, a temperature of a thermoelectric cooler TEC to perform wavelength alignment.

In a first implementation manner of the second aspect of the embodiments of the present invention, before the receiving, by a wavelength locking monitoring circuit by using a TO pin, a first optical power, which is monitored by a first MPD, of a forward transmitted light, and a second optical power that is monitored by a second MPD and that is after a backward emitted light and a backward reflected light complement each other, the method further includes:

reading, by the wavelength locking monitoring circuit, a temperature of the TEC at a standard working point, a first standard optical power M1 of the first MPD, and a second standard optical power M2 of the second MPD, calculating an average optical power Pa with t*M1+M2 in a preset effective wavelength region, and using Pa as input of an automatic optical power control loop, where an input end of the automatic power control loop is connected to the first MPD or the second MPD, and t is a preset proportion coefficient.

In a second implementation manner of the second aspect of the embodiments of the present invention, the comparing the first optical power with a first optical power detected last time, comparing the second optical power with a second optical power detected last time, and sending a comparison result to the wavelength locking control circuit, to enable the wavelength locking control circuit to adjust, according to the comparison result and by using the TO pin, a temperature of a thermoelectric cooler TEC includes:

comparing the first optical power with the first optical power detected last time, and comparing the second optical power with the second optical power detected last time;

if the first optical power is less than the first optical power detected last time, and the second optical power is greater than the second optical power detected last time, obtaining a first comparison result, where the first comparison result is that wavelengths of a forward emitted light and a backward emitted light that are emitted by a 10 G-directly modulated laser DML drift towards a longer wave;

sending the obtained first comparison result to the wavelength locking control circuit, to enable the wavelength locking control circuit to send, by using the TO pin, an instruction for reducing the temperature of the thermoelectric cooler TEC, and control a wavelength of the 10 G-DML to be aligned with the wavelength locking factor K0, where the wavelength locking factor K0 is a ratio of the current first optical power to the current second optical power or a difference between the current first optical power and the current second optical power;

otherwise, obtaining a second comparison result, where the second comparison result is that wavelengths of a forward emitted light and a backward emitted light that are emitted by the 10 G-DML drift towards a shorter wave; and sending the obtained second comparison result to the wavelength locking control circuit, to enable the wavelength locking control circuit to send, by using the TO pin, an instruction for increasing the temperature of the TEC, and control a wavelength of the 10 G-DML to be aligned with the wavelength locking factor K0, where the wavelength locking factor K0 is a ratio of the current first optical power to the current second optical power or a difference between the current first optical power and the current second optical power.

A third aspect of the embodiments of the present invention provides an optical transmitter, including:

a laser transmitter TO base, a thermoelectric cooler TEC, and a heat sink that are transverse and are connected sequentially from bottom to top;

a first monitor photodiode MPD, a 10 G-directly modulated laser DML, a collimation lens, and a narrowband optical filter that are disposed above the heat sink, where the first MPD is integrated into the 10 G-DML, the collimation lens is located between the 10 G-DML and the narrowband optical filter, and one side, which faces the collimation lens, of the narrowband optical filter is connected to the heat sink at a preset tilt angle;

a second monitor photodiode MPD disposed above the 10 G-DML into which the first MPD is integrated; and a wavelength locking monitoring circuit connected to a TO pin disposed at one side of the TO base, and a wavelength locking control circuit connected to the wavelength locking monitoring circuit, where a forward emitted light emitted by the 10 G-DML laser is input to the narrowband optical filter through the collimation lens, and a backward emitted light emitted by the 10 G-DML is input to the first MPD; and the narrowband optical filter reflects, at a preset elevation angle, the forward emitted light to the second MPD;

the first MPD receives and monitors a third optical power of the backward emitted light, and the second MPD receives and monitors a fourth optical power of a reflected light of the narrowband optical filter; and the wavelength locking monitoring circuit that receives the third optical power and the fourth optical power by using the TO pin separately compares a variation of a wavelength locking factor K0 with a corresponding threshold based on variations of the third optical power and the fourth optical power, and sends a comparison result to the wavelength locking control circuit, to enable the wavelength locking control circuit to adjust, according to the comparison result and by using the TO pin, a temperature of the TEC to perform wavelength alignment, where the wavelength locking factor K0 is a ratio of the first optical power to the second optical power or a difference between the first optical power and the second optical power.

In a first implementation manner of the third aspect of the embodiments of the present invention, the wavelength locking monitoring circuit that separately compares a variation of a wavelength locking factor K0 with a corresponding threshold based on variations of the third optical power and the fourth optical power, and sends a comparison result to the wavelength locking control circuit includes:

the wavelength locking monitoring circuit being configured to: calculate a wavelength locking factor K1 based on an average value of measurement values of third optical powers of the first MPD and an average value of measurement values of fourth optical powers of the second MPD, where the average values are acquired when the wavelength locking control circuit adjusts the temperature of the TEC by increasing the temperature of the TEC by preset a degrees Celsius and reducing the temperature of the TEC by preset a degrees Celsius, and determine whether a difference between the wavelength locking factor K1 and a wavelength locking factor K0 that is obtained in advance through calculation exceeds a threshold; if yes, calculate a wavelength locking factor K2 based on an average value of measurement values of third optical powers of the first MPD and an average value of measurement values of fourth optical powers of the second MPD, where the average values are acquired when the wavelength locking control circuit adjusts the temperature of the TEC by increasing the temperature of the TEC by preset b degrees Celsius and reducing the temperature of the TEC by preset b degrees Celsius, and determine whether a difference between the wavelength locking factor K2 and a wavelength locking factor K0 that is obtained through initial calculation exceeds a threshold; and if yes, determine that wavelengths of the forward emitted light and the backward emitted light that are emitted by the 10 G-DML drift, and enable the wavelength locking control circuit to send, by using the TO pin, an instruction for adjusting the temperature of the TEC, and control a wavelength of the 10 G-DML to be aligned with the wavelength locking factor K0, where preset b degrees Celsius is greater than preset a degrees Celsius.

A fourth aspect of the embodiments of the present invention provides a wavelength alignment method, applied to the foregoing optical transmitter disclosed in the third aspect of the embodiments of the present invention, where the method includes:

according to a preset time interval and based on a current standard working point, controlling a wavelength locking control circuit to adjust a temperature of the TEC to increase preset a degrees Celsius and reduce preset a degrees Celsius, and acquiring an average value of measurement values of third optical powers, which are obtained through two times of monitoring, of the first MPD, and an average value of measurement values of fourth optical powers, which are obtained through two times of monitoring, of the second MPD, to calculate a wavelength locking factor K1;

determining whether a difference between the wavelength locking factor K1 and a wavelength locking factor K0 that is obtained in advance through calculation exceeds a threshold, and if not, going back to the step of calculating a wavelength locking factor K1 according to a preset time interval and based on the current standard working point;

if yes, based on the current standard working point, controlling the wavelength locking control circuit to adjust the temperature of the TEC by increasing the temperature of the TEC by preset b degrees Celsius and reducing the temperature of the TEC by preset b degrees Celsius, and acquiring an average value of the measurement values of the third optical powers, which are obtained through two times of monitoring, of the first MPD, and an average value of measurement values of the fourth optical powers, which are obtained through two times of monitoring, of the second MPD, to calculate a wavelength locking factor K2, where preset b degrees Celsius is greater than preset a degrees Celsius;

determining whether a difference between the wavelength locking factor K2 and a wavelength locking factor K0 that is obtained through initial calculation exceeds a threshold, and if not, going back to the step of calculating a wavelength locking factor K1 according to a preset time interval and based on the current standard working point; and if yes, determining that wavelengths of a forward emitted light and a backward emitted light that are emitted by a 10 G-DML drift, and enabling the wavelength locking control circuit to send, by using the TO pin, an instruction for adjusting the temperature of the TEC, and control a wavelength of the 10 G-DML to be aligned with the wavelength locking factor K0.

In a first implementation manner of the fourth aspect of the embodiments of the present invention, the obtaining in advance a wavelength locking factor K0 through calculation includes:

reading, by the wavelength locking monitoring circuit, a temperature of the TEC at the current standard working point, a measurement value M3 of a third standard optical power of the first MPD, and a measurement value M4 of a fourth standard optical power of the second MPD, and reading a measurement value M5 of an optical power of the first MPD and a measurement value M6 of an optical power of the second MPD, where the measurement values M5 and M6 are after the temperature of the TEC is adjusted by a preset temperature; and calculating rates of changes in M3/M4 and M5/M6 with changes in the temperature, and using the rate of change as the wavelength locking factor K0, or using a ratio of M5 to M6 as the wavelength locking factor K0.

In a second implementation manner of the fourth aspect of the embodiments of the present invention, the enabling the wavelength locking control circuit to send, by using the TO pin, an instruction for adjusting the temperature of the TEC, and control a wavelength of the 10 G-DML to be aligned with the wavelength locking factor K0 includes:

based on the current standard working point, acquiring measurement values of optical powers of the first MPD and the second MPD that are detected after the wavelength locking control circuit adjusts the temperature of the TEC, to calculate a wavelength locking factor K3; if the wavelength locking factor K3 is not within a reference wavelength locking factor range, continuing to enable the wavelength locking control circuit to adjust the temperature of the TEC, until the wavelength locking factor K3 is within the reference wavelength locking factor range, where the reference wavelength locking factor range is [K0−K, K0+K'], and K and K' have a same value or have different values, and are both less than K0;

controlling the wavelength of the 10 G-DML to be aligned with the wavelength locking factor K0; and if the wavelength locking factor K3 is within the reference wavelength locking factor range and is less than the threshold, setting a current temperature of the TEC, where the measurement values of the optical powers of the first MPD and the second MPD are values at a next standard working point.

A fifth aspect of the embodiments of the present invention provides an optical transmitter, including:

a laser transmitter TO base, a thermoelectric cooler TEC, and a heat sink that are transverse and are connected sequentially from bottom to top;

a first monitor photodiode MPD, a 10 G-directly modulated laser DML, a collimation lens, and a narrowband optical filter that are disposed above the heat sink, where the first MPD is integrated into the 10 G-DML, the collimation lens is located between the 10 G-DML and the narrowband optical filter, and one side, which faces the collimation lens, of the narrowband optical filter is connected to the heat sink at a preset tilt angle;

a second MPD that is disposed above the narrowband optical filter and connected to the narrowband optical filter; and a wavelength locking monitoring circuit connected to a TO pin disposed at one side of the TO base, and a wavelength locking control circuit connected to the wavelength locking monitoring circuit, where a forward emitted light emitted by the 10 G-DML laser is input to the narrowband optical filter through the collimation lens, and a backward emitted light emitted by the 10 G-DML is input to the first MPD; and the narrowband optical filter reflects a forward transmitted light, which is split from the forward emitted light, to the second MPD connected to the narrowband optical filter;

the first MPD receives and monitors a fifth optical power of the backward emitted light, and the second MPD receives and monitors a sixth optical power of the forward transmitted light; and the wavelength locking monitoring circuit that receives the fifth optical power and the sixth optical power by using the TO pin separately compares a variation of a wavelength locking factor K0 with a corresponding threshold based on variations of the fifth optical power and the sixth optical power, and sends a comparison result to the wavelength locking control circuit, to enable the wavelength locking control circuit to adjust, according to the comparison result and by using the TO pin, a temperature of the TEC to perform wavelength alignment.

In a first implementation manner of the fifth aspect of the embodiments of the present invention, the wavelength locking monitoring circuit that separately compares a variation of a wavelength locking factor K0 with a corresponding threshold based on variations of the fifth optical power and the sixth optical power, and sends a comparison result to the wavelength locking control circuit includes:

the wavelength locking monitoring circuit being configured to: calculate a wavelength locking factor K4 based on an average value of measurement values of fifth optical powers of the first MPD and an average value of measurement values of sixth optical powers of the second MPD, where the average values are acquired when the wavelength locking control circuit adjusts the temperature of the TEC by increasing the temperature of the TEC by preset d degrees Celsius and reducing the temperature of the TEC by preset d degrees Celsius, and determine whether a difference between the wavelength locking factor K4 and a wavelength locking factor K0 that is obtained through initial calculation exceeds a threshold; if yes, calculate a wavelength locking factor K5 based on an average value of measurement values of fifth optical powers of the first MPD and an average value of measurement values of sixth optical powers of the second MPD, where the average values are acquired when the wavelength locking control circuit adjusts the temperature of the TEC by increasing the temperature of the TEC by preset e degrees Celsius and reducing the temperature of the TEC by preset e degrees Celsius, and determine whether a difference between the wavelength locking factor K5 and a wavelength locking factor K0 that is obtained through initial calculation exceeds a threshold; and if yes, determine that wavelengths of the forward emitted light and the backward emitted light that are emitted by the 10 G-DML drift, and enable the wavelength locking control circuit to send, by using the TO pin, an instruction for adjusting the temperature of the TEC, and control a wavelength of the 10 G-DML to be aligned with the wavelength locking factor K0, where preset e degrees Celsius is greater than preset d degrees Celsius.

A sixth aspect of the embodiments of the present invention provides a wavelength alignment method, applied to the foregoing optical transmitter provided in the fifth aspect of the embodiments of the present invention, where the method includes:

according to a preset time interval and based on an initial working point, controlling a wavelength locking control circuit to adjust a temperature of the TEC to increase preset d degrees Celsius and reduce preset d degrees Celsius, and acquiring an average value of measurement values of fifth optical powers, which are obtained through two times of monitoring, of the first MPD, and an average value of measurement values of sixth optical powers, which are obtained through two times of monitoring, of the second MPD, to calculate a wavelength locking factor K4;

determining whether a difference between the wavelength locking factor K4 and a wavelength locking factor K0 that is obtained through initial calculation exceeds a threshold, and if not, going back to the step of calculating a wavelength locking factor K4 according to a preset time interval and based on the initial working point; and if yes, based on the initial working point, controlling the wavelength locking control circuit to adjust the temperature of the TEC by increasing the temperature of the TEC by preset e degrees Celsius and reducing the temperature of the TEC by preset e degrees Celsius, and acquiring an average value of the measurement values of the fifth optical powers, which are obtained through two times of monitoring, of the first MPD, and an average value of the measurement values of the sixth optical powers, which are obtained through two times of monitoring, of the second MPD, to calculate a wavelength locking factor K5, where preset e degrees Celsius is greater than preset d degrees Celsius;

determining whether a difference between the wavelength locking factor K5 and a wavelength locking factor K0 that is obtained through initial calculation exceeds a threshold, and if not, going back to the step of calculating a wavelength locking factor K4 according to a preset time interval and based on the initial working point; and if yes, determining that wavelengths of a forward emitted light and a backward emitted light that are emitted by a 10 G-DML drift, and enabling the wavelength locking control circuit to send, by using the TO pin, an instruction for adjusting the temperature of the TEC, and control a wavelength of the 10 G-DML to be aligned with the wavelength locking factor K0.

In a first implementation manner of the sixth aspect of the embodiments of the present invention, the obtaining a wavelength locking factor K0 through initial calculation includes:

calculating a wavelength locking factor K0 according to a TEC that has a determined temperature and that is obtained by initializing the 10 G-DFB, and the measurement values of the fifth optical power of the first MPD and the sixth optical power of the second MPD; and the initializing the 10 G-DML includes:

testing a correspondence between a power P and a drive current I of the tube core of the DML, and setting an initial bias current Ib and a modulation current Im of the DML according to the correspondence;

in a case of adding a 10 G-signal, scanning the temperature of the TEC, and searching for a greatest power value of the 10 G-DML;

increasing the temperature of the TEC according to the greatest power value, and measuring a current optical output power, an extinction ratio ER, and an eye pattern;

when the current optical output power is greater than 2 dBm, determining that a corresponding temperature of the TEC is a lower limit initial value of an effective wavelength region of the narrowband optical filter;

when the extinction ratio ER is greater than a preset ratio, and the eye pattern meets a standard mask, determining that the corresponding temperature of the TEC is an upper limit initial value of the effective wavelength region of the narrowband optical filter; and within a range formed by the upper limit initial value and the lower limit initial value, measuring whether sensitivity of a boundary point and an intermediate zone of the range is less than preset sensitivity;

if yes, setting a middle point in the range formed by the upper limit initial value and the lower limit initial value as an initial working point, and preliminarily determining that an initial status of the 10 G-DML includes the temperature of the TEC at the initial working point, and the measurement values of the fifth optical power of the first MPD and the sixth optical power of the second MPD; and if not, based on the boundary point, narrowing the boundary point of the effective wavelength region inwards, until it is found through measurement that sensitivity of a narrowed boundary point and the intermediate zone is less than the preset sensitivity.

In a second implementation manner of the sixth aspect of the embodiments of the present invention, the enabling the wavelength locking control circuit to send, by using the TO pin, an instruction for adjusting the temperature of the TEC, and control a wavelength of the 10 G-DML to be aligned with the wavelength locking factor K0 includes:

based on the initial working point, acquiring the measurement values of the fifth optical power of the first MPD and the sixth optical power of the second MPD to calculate a wavelength locking factor K6, where the fifth optical power and the sixth optical power are detected after the wavelength locking control circuit adjusts the temperature of the TEC, and if the wavelength locking factor K6 is not within a reference wavelength locking factor range, continuing to enable the wavelength locking control circuit to adjust the temperature of the TEC, until the wavelength locking factor K6 is within the reference wavelength locking factor range, where the reference wavelength locking factor range is [K0−K, K0+K'], and K and K' have a same value or have different values, and are both less than K0; and controlling the wavelength of the 10 G-DML to be aligned with the wavelength locking factor K0.

A seventh aspect of the embodiments of the present invention provides a passive optical network system, including: an optical line terminal OLT, a beam splitter, an optical network unit ONU, and an optical fiber, where the optical fiber includes: a feeder optical fiber and a distribution optical fiber, and the OLT includes the optical transmitter described in any one of the first aspect, the third aspect, and the fifth aspect of the embodiments of the present invention;

one end of the feeder optical fiber is connected to the OLT, and the other end is connected to the beam splitter;

the beam splitter is connected to the feeder optical fiber to form an optical distribution network ODN; and multiple optical network units ONUs are connected to the beam splitter by using the distribution optical fiber, and are connected to the OLT by using the feeder optical fiber and after being aggregated.

It can be seen from the foregoing technical solutions that, compared with the prior art, the embodiments of the present invention disclose an optical transmitter, a wavelength alignment method, and a passive optical network system, for the foregoing optical transmitter disclosed in the embodiments of the present invention, a 10 G-DML, an MPD 1, an MPD 2, a collimation lens, and a narrowband optical filter are disposed in a TO thereof; therefore, monitoring of an optical power can be achieved, a component, such as an optical isolator or a beam splitter in the TO is saved, and packaging of a DML and a filter in the TO is achieved in a manner of a low cost. In addition, received optical powers are monitored by using the MPD 1 and the MPD 2, the detected optical powers are output to a wavelength locking monitoring circuit by using a TO pin, variations, which are detected by the wavelength locking monitoring circuit, of the foregoing detected optical powers and a variation of a wavelength locking factor K0 are separately compared with corresponding thresholds, and a comparison result are sent to the wavelength locking control circuit, to enable the wavelength locking control circuit to adjust, according to the comparison result and by using the TO pin, a temperature of a TEC to perform wavelength alignment. In the embodiments of the present invention, wavelength locking control is performed on a wavelength of a 10 G-DML and a filter by using a novel wavelength monitor loop, so that the optical transmitter disclosed in the embodiments of the present invention can achieve an objective of a high modulation rate with a low cost and low power consumption, where a chirp phenomenon is reduced, thereby enabling the optical transmitter to be applied to a 10 G-PON currently and a higher-rate PON system in the future.

BRIEF DESCRIPTION OF THE DRAWINGS

To describe the technical solutions in the embodiments of the present invention more clearly, the following briefly introduces the accompanying drawings required for describing the embodiments or the prior art. Apparently, the accompanying drawings in the following description show merely the embodiments of the present invention, and a person of ordinary skill in the art may still derive other drawings from these accompanying drawings without creative efforts.

DETAILED DESCRIPTION

For ease of reference and clarity, descriptions, abbreviations, or acronyms of technical teens used hereinafter are summarized as follows:

PON: Passive Optical Network, passive optical network;
LD: Laser Diode, laser diode;
OLT: Optical Line Terminal, optical line terminal; BS: Beam Splitter, beam splitter;
DML: Directly Modulated Laser, directly modulated laser; Isolator: optical isolator;
MPD: Monitor Photodiode Detector, monitor photodiode detector;
ODN: Optical Distribution Network, optical distribution network;
ONU: Optical Network Unit, optical network unit;
TO: Transmitter Optical, laser transmitter; Etalon FILTER, Etalon filter;
DFB: Distributed Feedback Laser, distributed feedback laser;
CML: Chirp Managed Laser, chirp managed laser;
ER: Extinction Ratio, extinction ratio; TEC: Thermoelectric Cooler, thermoelectric cooler.

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

It can be seen from the background that, a transmission and direct modulation manner of a traditional DML refers to modulating output of a semiconductor laser by changing an injected current, a structure of the traditional DML is simple and is easy to implement, and a cost is low. However, a modulation current causes a change in an active layer refractive index, causing that a phase of a light is modulated, and therefore, an operating frequency is broadened, a relatively great frequency chirp further exists, and with increase of a modulation rate, a chirp phenomenon becomes more serious. Apparently, it is difficult to directly use the traditional DML as a transmitter of a high-speed OLT optical module of 10 G or above. Therefore, the embodiments of the present invention disclose several novel optical transmitters that have a novel structure of packaging a DML and an Etalon component in a minimized manner, and wavelength alignment methods corresponding to the optical transmitters, so that the optical transmitters can be used as transmitters of high-speed OLT optical modules of 10 G or above, which are described in detail in the following embodiments.

Embodiment 1

Figure 1:
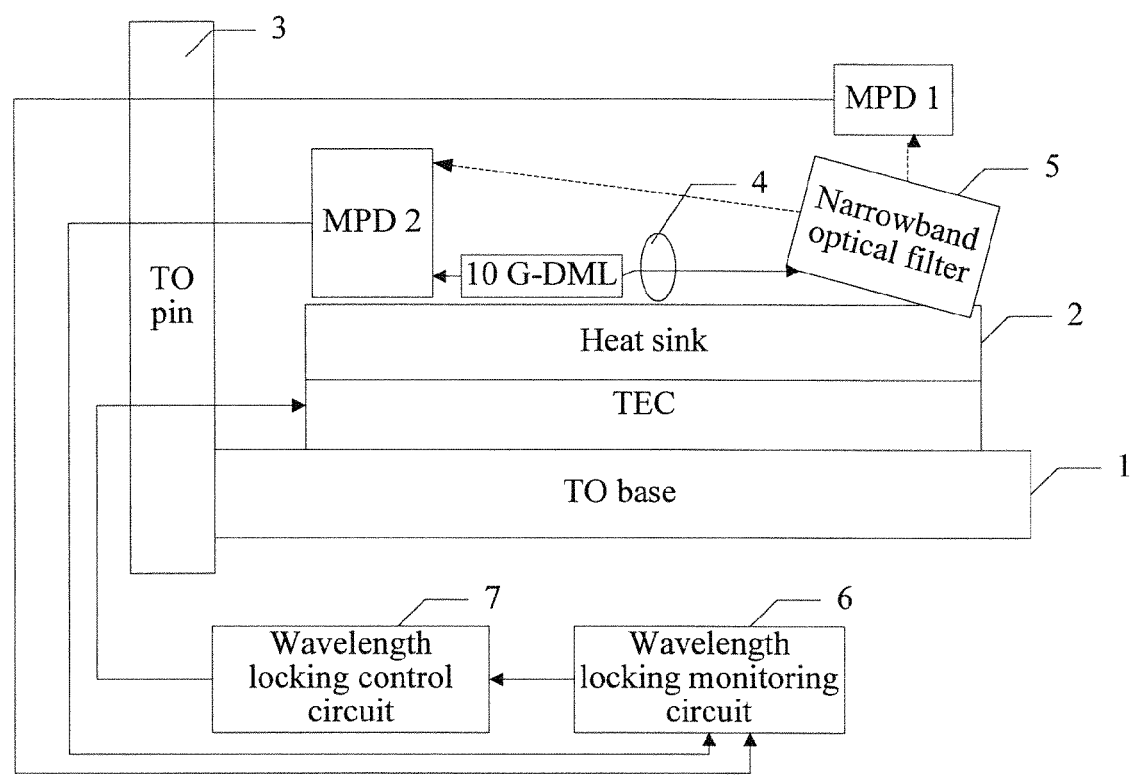
FIG. 1 is a schematic structural diagram of an optical transmitter according to Embodiment 1 of the present invention.

FIG. 1 is an optical transmitter according to this embodiment of the present invention, mainly including:
a TO base 1, a TEC, and a heat sink 2 that are transverse and are connected sequentially from bottom to top;
a TO pin 3 whose one side is connected to one end of the TO base 1;
a second MPD (which is shown as an MPD 2 in FIG. 1), a 10 G-DML, a collimation lens 4, and a narrowband optical filter 5 that are disposed above the heat sink 2, where the MPD 2 and the collimation lens 4 are located at two sides of the 10 G-DML, and the narrowband optical filter 5 is located at the other side of the collimation lens 4, and one side, which faces the collimation lens 4, of the narrowband optical filter 5 is connected to the heat sink 2 at preset tilt angle;
a first MPD (which is shown as an MPD 1 in FIG. 1) disposed above the narrowband optical filter 5; and a wavelength locking monitoring circuit 6 connected to the TO pin 3 disposed at one side of the TO base 1, and a wavelength locking control circuit 7 connected to the wavelength locking monitoring circuit 6, where a forward emitted light emitted by the 10 G-DML is input to the narrowband optical filter 5 through the collimation lens 4, and a backward emitted light emitted by the 10 G-DML is input to the MPD 2; and the narrowband optical filter 5 splits the forward emitted light into a forward transmitted light and a backward reflected light, transmits, at a preset elevation angle, the backward reflected light to the MPD 2, and partially reflect the forward transmitted light to the MPD 1 connected to the narrowband optical filter 5, where the forward transmitted light herein may refer to the entire forward transmitted light, or may refer to one part of the forward transmitted light;

the MPD 1 receives and monitors a first optical power of the forward transmitted light, and the MPD 2 receives and monitors a second optical power that is after the backward emitted light and the backward reflected light complement each other; and the wavelength locking monitoring circuit 6 that receives the first optical power and the second optical power by using the TO pin 3 separately compares detected variations of the first optical power and the second optical power and a variation of a wavelength locking factor K0 with corresponding thresholds, and sends a comparison result to the wavelength locking control circuit 7, to enable the wavelength locking control circuit 7 to adjust, according to the comparison result and by using the TO pin 3, a temperature of the TEC.

Preferably, the wavelength locking monitoring circuit 6 that separately compares detected variations of the first optical power and the second optical power and a variation of a wavelength locking factor K0 with corresponding thresholds, and sends a comparison result to the wavelength locking control circuit 7 includes:

when the variations of the first optical power and the second optical power and the variation of the wavelength locking factor K0 exceed the corresponding thresholds, comparing the first optical power with a first optical power detected last time, and comparing the second optical power with a second optical power detected last time, and if the first optical power is less than the first optical power detected last time, and the second optical power is greater than the second optical power detected last time, obtaining a first comparison result, and sending the first comparison result to the wavelength locking control circuit; otherwise, obtaining a second comparison result, and sending the second comparison result to the wavelength locking control circuit, where the first comparison result is that wavelengths of the forward emitted light and the backward emitted light that are emitted by the 10 G-DML drift towards a longer wave; and the second comparison result is that wavelengths of the forward emitted light and the backward emitted light that are emitted by the 10 G-DML drift towards a shorter wave.

Similarly, the wavelength locking control circuit 7 that adjusts, according to the comparison result and by using the TO pin, a temperature of the TEC to perform wavelength alignment includes: when the first comparison result is received, sending, by using the TO pin, an instruction for reducing the temperature of the thermoelectric cooler TEC, and controlling a wavelength of the 10 G-DML to be aligned with the wavelength locking factor K0; or when the second comparison result is received, sending, by using the TO pin, an instruction for increasing the temperature of the TEC, and controlling a wavelength of the 10 G-DML to be aligned with the wavelength locking factor K0.

Based on the optical transmitter disclosed in this embodiment of the present invention, a BS is built in the narrowband optical filter 5, and one surface, which is in contact with the heat sink 2, of the narrowband optical filter 5 is machined to be at an oblique angle, and the narrowband optical filter may also be an Etalon FILTER having an obliquely built-in BS; and the 10 G-DML may also be a 10 G-DFB.

Based on this, the forward emitted light emitted by the 10 G-DML is input to the narrowband optical filter 5 through the collimation lens 4, main energy of the forward emitted light enters an optical fiber through the narrowband optical filter 5 to transmit a data signal, some energy, that is, the forward transmitted light, is reflected by a BS built in the narrowband optical filter 5 to the MPD 1, and the MPD 1 monitors an optical power of the received forward transmitted light.

In addition, one surface, which is in contact with the heat sink 2, of the narrowband optical filter 5 is machined to be at an oblique angle, and therefore, an incident surface of the narrowband optical filter 5 uses one part of the forward emitted light as a backward reflected light and reflects, at an elevation angle, the backward reflected light to the MPD 2 that is at the rear of the 10 G-DML (which may also be considered to be at the rear of an LD chip). Because there is an elevation angle (where the elevation angle has a relationship with the foregoing oblique angle between the narrowband optical filter 5 and the heat sink, where a greater oblique angle indicates a greater elevation angle), the backward reflected light is not injected into the 10 G-DML (not input to the LD chip), which, in other words, does not interfere with normal operation of the 10 G-DML. At this time, the MPD 2 also receives a backward emitted light emitted backwards from the 10 G-DML.

Specifically, the optical power monitored by the MPD 2 has two parts, including: the backward emitted light (which may also be referred to as a backward direct current light) of the 10 G-DML and a backward reflected light (which may also be referred to as a periodically reflected light of the narrowband optical filter), which is reflected by the narrowband optical filter, in the forward emitted light of the 10 G-DML; and therefore, the MPD in fact monitors an optical power that is after the backward emitted light and the backward reflected light complement each other.

For the foregoing optical transmitter disclosed in this embodiment of the present invention, a 10 G-DML, an MPD 1, an MPD 2, a collimation lens, and a narrowband optical filter are disposed in a TO thereof; therefore, monitoring of an optical power can be achieved, a component, such as an optical isolator or a beam splitter in the TO is saved, and packaging of a DML and a filter in the TO is achieved in a manner of a low cost. In addition, a first optical power of a forward transmitted light is monitored by the MPD 1, a second optical power that is after a backward emitted light and a backward reflected light complement each other is monitored by the MPD 2, the detected optical powers are output to a wavelength locking monitoring circuit by using a TO pin, variations, which are detected by the wavelength locking monitoring circuit, of the first optical power and the second optical power and a variation of a wavelength locking factor K0 are separately compared with corresponding thresholds, and a comparison result are sent to the wavelength locking control circuit, to enable the wavelength locking control circuit to adjust, according to the comparison result and by using the TO pin, a temperature of a TEC.

In this embodiment of the present invention, wavelength locking control is performed on a wavelength of a 10 G-DML and a narrowband optical filter by using a novel wavelength monitor loop, so that the optical transmitter disclosed in this embodiment of the present invention can achieve an objective of a high modulation rate with a low cost and low power consumption, where a chirp phenomenon is reduced, thereby enabling the optical transmitter to be applied to a 10 G-PON currently and a higher-rate PON system in the future.

Embodiment 2

Figure 2:
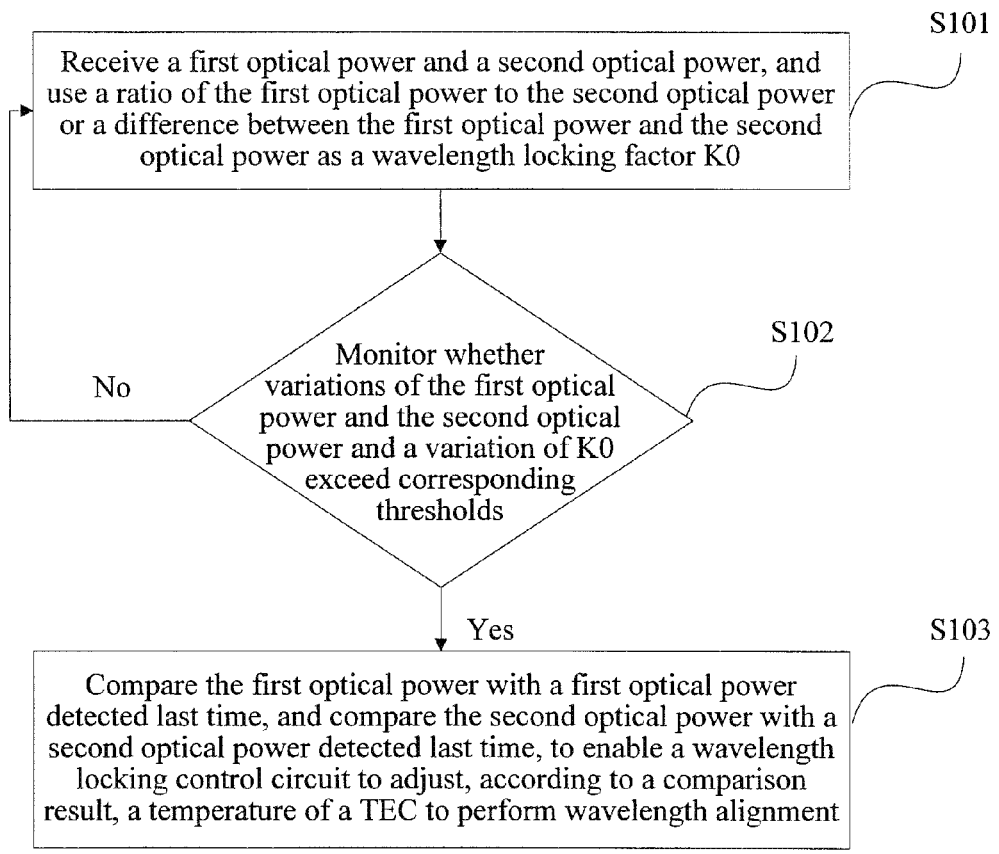
FIG. 2 is a flowchart of a wavelength alignment method according to Embodiment 2 of the present invention.

Based on an optical transmitter disclosed in Embodiment 1 of the present invention, based on the optical transmitter, this embodiment of the present invention further correspondingly discloses a wavelength alignment method. The method is based on a schematic structural diagram of an optical transmitter shown in FIG. 1, and as shown in FIG. 2, mainly includes the following steps:

Step S101. A wavelength locking monitoring circuit receives, by using a TO pin, a first optical power, which is monitored by a first MPD, of a forward transmitted light, and a second optical power that is monitored by a second MPD and that is after a backward emitted light and a backward reflected light complement each other, and uses a ratio of the first optical power to the second optical power or a difference between the first optical power and the second optical power as a wavelength locking factor K0.

During performing of step S101, based on the optical transmitter disclosed in FIG. 1, the forward transmitted light monitored by the first MPD is one part of a forward emitted light emitted by a 10 G-DML. Specifically: the forward emitted light emitted by the 10 G-DML is input to the narrowband optical filter 5 through a collimation lens 4, the forward emitted light is split into two parts in a narrowband optical filter 5, one part of energy thereof is used as the forward transmitted light and is reflected by a BS built in the narrowband optical filter 5 to an MPD 1, and the MPD 1 monitors an optical power of the received forward transmitted light.

The other part is used as a backward reflected light and is reflect at an elevation angle to an MPD 2 at the rear of the 10 G-DML, and the MPD 2 receives a backward emitted light emitted by the 10 G-DML; and therefore, during performing of step S101, an optical power monitored by the second MPD is an optical power that is after the received backward emitted light and the backward reflected light complement each other. It should be noted that "first" and "second" herein are used only for differentiating different monitored optical powers.

Figure 3:
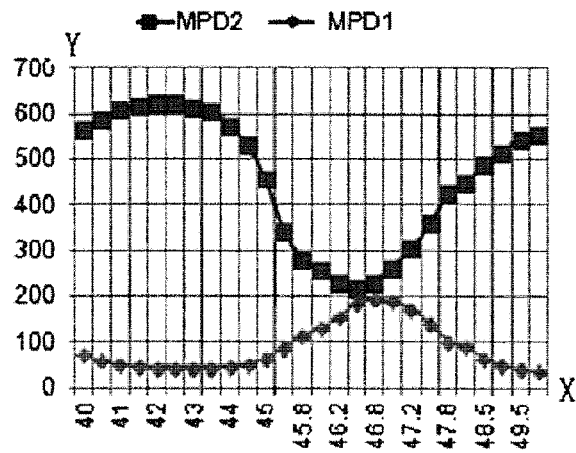
FIG. 3 is a curve comparison diagram of optical powers that are monitored by an MPD 1 and an MPD 2 in a wavelength alignment method according to Embodiment 2 of the present invention.

FIG. 3 is a spectrum tendency chart showing a forward transmitted light monitored by an MPD 1 and a fact after a backward emitted light monitored by the MPD 2 and a backward reflected light complement each other. It can be seen from FIG. 3 that, lights monitored by the MPD 1 and the MPD 2 complement each other, where an X-axis indicates a value of a temperature of the TEC, and a Y-axis indicates a value of an optical power that corresponds to the temperature of the TEC.

Step S102. The wavelength locking monitoring circuit monitors whether variations of the first optical power and the second optical power and a variation of the wavelength locking factor K0 exceed corresponding thresholds; if the variations exceed the corresponding thresholds, perform step S103, and if the variations do not exceed the corresponding thresholds, go back to perform step S101.

In step S102, the wavelength locking monitoring circuit monitors variations of a first optical power and a second optical power, and a variation of a wavelength locking factor K0 that are received in real time, and determines in real time whether the variation of the first optical power exceeds a corresponding threshold, and determines whether the variation of the second optical power exceeds a corresponding threshold, and whether the variation of the wavelength locking factor K0 exceeds a corresponding threshold. It should be noted that the respective corresponding thresholds with which the foregoing variations are compared may be the same or may be different. In addition, a wavelength locking factor K0 determined each time is a ratio of a currently detected first optical power to a currently detected second optical power or a difference between a currently detected first optical power and a currently detected second optical power.

Step S103. When the variations of the first optical power and the second optical power and the variation of the wavelength locking factor K0 exceed the corresponding thresholds, compare the first optical power with a first optical power detected last time, compare the second optical power with a second optical power detected last time, and send a comparison result to the wavelength locking control circuit, to enable the wavelength locking control circuit to adjust, according to the comparison result and by using the TO pin, a temperature of a thermoelectric cooler TEC to perform wavelength alignment.

During performing of step S103, it is determined that the variations of the first optical power and the second optical power that are detected or received by the wavelength locking monitoring circuit at this time and the variation of the wavelength locking factor K0 exceeds the corresponding thresholds. Therefore, if step S103 is performed, a value actually corresponding to the variation is determined, that is, the first optical power is compared with a first optical power detected last time, the second optical power is compared with a second optical power detected last time, and a comparison result obtained through the comparison are sent to the wavelength locking control circuit, to enable the wavelength locking control circuit to adjust, according to the comparison result and by using the TO pin, the temperature of the thermoelectric cooler TEC to perform wavelength alignment.

By using the wavelength alignment method disclosed in this embodiment of the present invention, wavelength locking control can be performed on a wavelength of a 10 G-DML and a narrowband optical filter, so that a corresponding optical transmitter can achieve an objective of a high modulation rate with a low cost and low power consumption, where a chirp phenomenon is reduced, thereby enabling the optical transmitter to be applied to a 10 G-PON currently and a higher-rate PON system in the future.

Embodiment 3

Based on an optical transmitter disclosed in Embodiment 1 and a wavelength alignment method disclosed in Embodiment 2 of the present invention, before step S101 of receiving, by a wavelength locking monitoring circuit by using a TO pin, a first optical power, which is monitored by a first MPD, of a forward transmitted light, and a second optical power that is monitored by a second MPD and that is after a backward emitted light and a backward reflected light complement each other is performed, the following steps are further included:

Step S100. The wavelength locking monitoring circuit reads a temperature of a TEC at a standard working point, a first standard optical power M1 of the first MPD, and a second standard optical power M2 of the second MPD, calculates an average optical power Pa with t*M1+M2 in a preset effective wavelength region, and uses Pa as input of an automatic optical power control loop, where an input end of the automatic power control loop is connected to the first MPD or the second MPD, and t is a preset proportion coefficient.

In step S100, a preset effective wavelength region is formed by combining the 10 G-DML with the narrowband optical filter, that is, relative locations of wavelengths of the 10 G-DML and the narrowband optical filter are in an area in a range, and a preset effective wavelength region is determined by an overall performance test.

In step S100, during calculation of the average optical power Pa, because the first standard optical power M1 and the second standard optical power M2 have a complementary relationship, M1 multiplied by the preset proportion coefficient t then plus M2 approximately makes a constant, and the average optical power Pa is calculated based on the constant, which can ensure stability of an original optical power. Subsequently, the average optical power Pa is used as input of the automatic optical power control loop. Because the input end of the automatic power control loop is connected to the first MPD or the second MPD, based on the stable original optical power, during performing of subsequent step S101 to step S103 shown in FIG. 2, a forward emitted light and a backward emitted light that are emitted by an MPD 1 and an MPD 2 to the 10 G-DML are not affected.

Embodiment 4

Based on an optical transmitter disclosed in Embodiment 1 and a wavelength alignment method disclosed in Embodiment 2 and/or Embodiment 3 of the present invention, in step S103, the comparing the first optical power with a first optical power detected last time, comparing the second optical power with a second optical power detected last time, and sending a comparison result to the wavelength locking control circuit, to enable the wavelength locking control circuit to adjust, according to the comparison result and by using the TO pin, a temperature of a thermoelectric cooler TEC specifically includes the following steps:

Step S1031. Compare the first optical power with the first optical power detected last time, and compare the second optical power with the second optical power detected last time; and if the first optical power is reduced and the second optical power is increased, perform step S1032; otherwise, perform step S1034.

Step S1032. If the first optical power is less than the first optical power detected last time, and the second optical power is greater than the second optical power detected last time, obtain a first comparison result, where the first comparison result is that wavelengths of a forward emitted light and a backward emitted light that are emitted by a 10 G-directly modulated laser DML drift towards a longer wave.

Step S1033. Send the first comparison result to the wavelength locking control circuit, to enable the wavelength locking control circuit to send, by using the TO pin, an instruction for reducing the temperature of the thermoelectric cooler TEC, and control a wavelength of the 10 G-DML to be aligned with the wavelength locking factor K0, where the wavelength locking factor K0 is a ratio of the current first optical power to the current second optical power or a difference between the current first optical power and the current second optical power.

Step S1034. If the first optical power is less than the first optical power detected last time, and the second optical power is less than or equal to the second optical power detected last time a; or if the first optical power is greater than or equal to the first optical power detected last time, and the second optical power is greater than the second optical power detected last time; or if the first optical power is greater than the first optical power detected last time, and the second optical power is less than the second optical power detected last time, obtain a second comparison result, where the second comparison result is that wavelengths of a forward emitted light and a backward emitted light that are emitted by a 10 G-DML drift towards a shorter wave.

Step S1035. Send the second comparison result to the wavelength locking control circuit, to enable the wavelength locking control circuit to send, by using the TO pin, an instruction for increasing the temperature of the TEC, and control a wavelength of the 10 G-DML to be aligned with the wavelength locking factor K0, where the wavelength locking factor K0 is a ratio of the current first optical power to the current second optical power or a difference between the current first optical power and the current second optical power.

Figure 4:
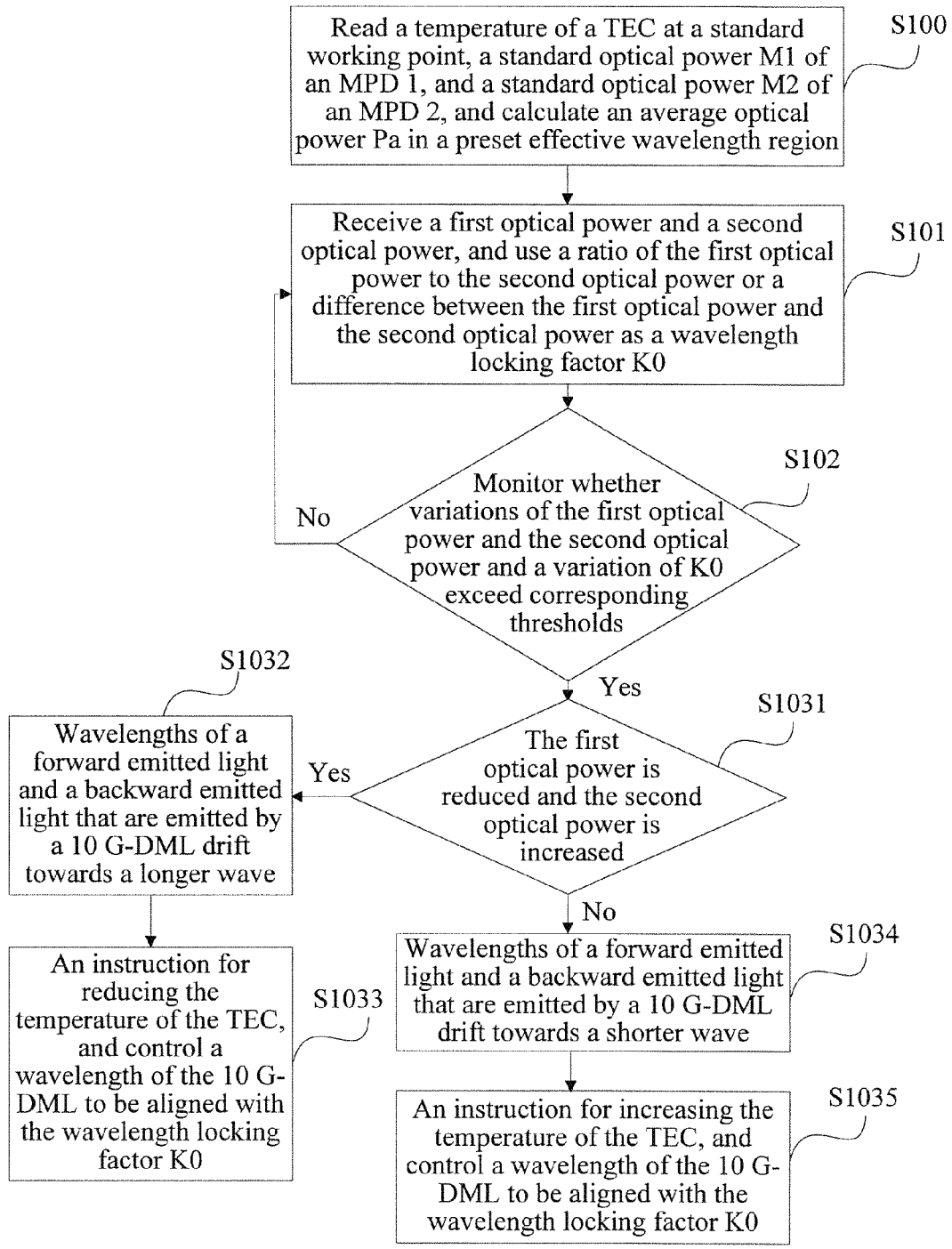
FIG. 4 is a flowchart of a wavelength alignment method according to Embodiment 2 to Embodiment 4 of the present invention.

Summing up the foregoing process of the wavelength alignment method in Embodiment 2 to Embodiment 4, a specific flowchart is shown in FIG. 4.

In the wavelength alignment method disclosed in Embodiment 2 to Embodiment 4, a first optical power of a forward transmitted light is monitored by an MPD 1, a second optical power that is after a backward emitted light and the backward reflected light complement each other is monitored by an MPD 2, the detected optical powers are output to a wavelength locking monitoring circuit by using a TO pin, variations, which are detected by the wavelength locking monitoring circuit, of the first optical power and the second optical power and a variation of a wavelength locking factor K0 are separately compared with corresponding thresholds, and a comparison result are sent to the wavelength locking control circuit, to enable the wavelength locking control circuit to adjust, according to the comparison result and by using the TO pin, a temperature of a TEC to perform wavelength alignment. In this embodiment of the present invention, a narrowband optical filter that has an oblique angle with a heat sink is used, and a backward reflected light thereof is directly reflected to an MPD 1 without interfering with an LD or a 10 G-DML; and in addition, wavelength locking control is performed on a wavelength of the 10 G-DML and a filter by using a novel wavelength monitor loop, so that an optical transmitter disclosed in this embodiment of the present invention can achieve an objective of a high modulation rate with a low cost and low power consumption, where a chirp phenomenon is reduced, thereby enabling the optical transmitter to be applied to a 10 G-PON currently and a higher-rate PON system in the future.

This embodiment of the present invention further discloses an optical transmitter, where similarly, a 10 G-DML, an MPD 1, an MPD 2, a collimation lens, and a narrowband optical filter are disposed in a TO; therefore, monitoring of an optical power can be achieved, and the optical transmitter disclosed in this embodiment of the present invention can achieve an objective of a high modulation rate with a low cost and low power consumption, where a chirp phenomenon is reduced, thereby enabling the optical transmitter to be applied to a 10 G-PON currently and a higher-rate PON system in the future, which is specifically described as follows.

Embodiment 5

Figure 5:
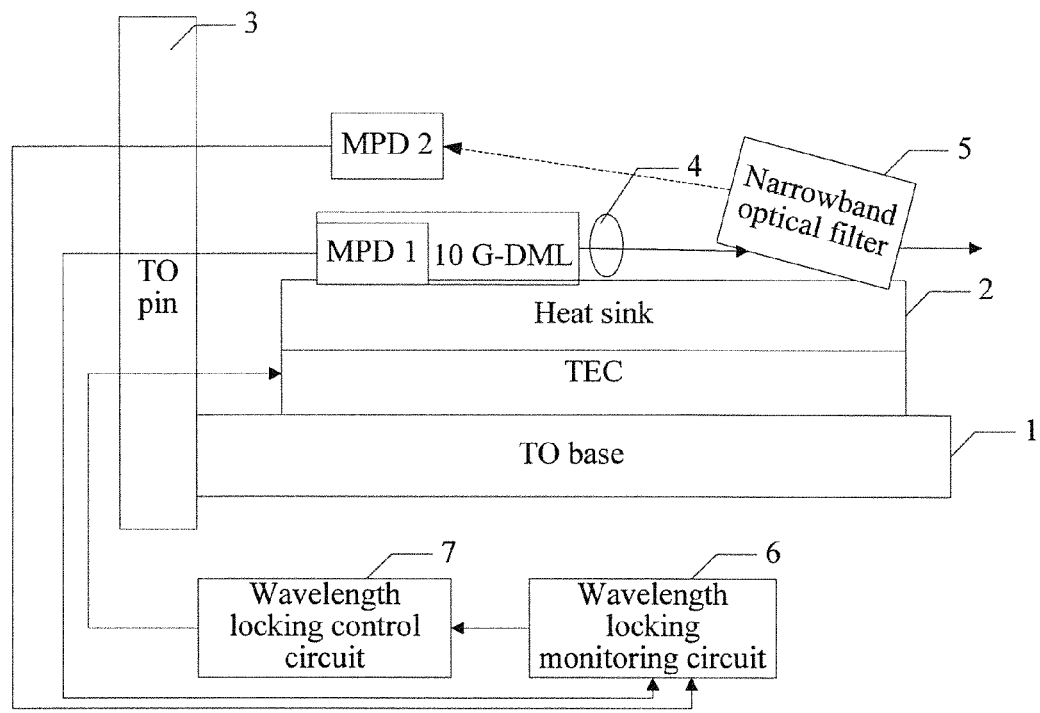
FIG. 5 is a schematic structural diagram of an optical transmitter according to Embodiment 5 of the present invention.

FIG. 5 is an optical transmitter according to Embodiment 5 of the present invention, mainly including:

a TO base 1, a TEC, and a heat sink 2 that are transverse and are connected sequentially from bottom to top;

a TO pin 3 whose one side is connected to one end of the TO base 1;

a first MPD (which is shown as an MPD 1 in FIG. 5), a 10 G-DML, a collimation lens 4, and a narrowband optical filter 5 that are disposed above the heat sink 2, where the MPD 1 is integrated into the 10 G-DML, the collimation lens 4 is located between the 10 G-DML and the narrowband optical filter 5, and one side, which faces the collimation lens 4, of the narrowband optical filter 5 is connected to the heat sink 2 at a preset tilt angle;

a second MPD (which is shown as an MPD 2 in FIG. 5) disposed above the 10 G-DML into which the MPD 1 is integrated; and a wavelength locking monitoring circuit 6 connected to the TO pin 3 disposed at one side of the TO base 1, and a wavelength locking control circuit 7 connected to the wavelength locking monitoring circuit 6, where a forward emitted light emitted by the 10 G-DML is input to the narrowband optical filter 5 through the collimation lens 4, and a backward emitted light emitted by the 10 G-DML is input to the MPD 1; and the narrowband optical filter 5 reflects, at a preset elevation angle, the forward emitted light to the MPD 2, that is, the MPD 2 receives a reflected light of the narrowband optical filter 5;

the MPD 1 receives and monitors a third optical power of the backward emitted light, and the MPD 2 receives and monitors a fourth optical power of the reflected light of the narrowband optical filter; and the wavelength locking monitoring circuit 6 that receives the third optical power and the fourth optical power by using the TO pin 3 separately compares a variation of a wavelength locking factor K0 with a corresponding threshold based on variations of the third optical power and the fourth optical power, and sends a comparison result to the wavelength locking control circuit 7, to enable the wavelength locking control circuit 7 to adjust, according to the comparison result and by using the TO pin 3, a temperature of the TEC to perform wavelength alignment, where the wavelength locking factor K0 is a ratio of the third optical power to the fourth optical power or a difference between the third optical power and the fourth optical power.

It should be noted that "first", "second", "third", and "fourth" herein are used only for differentiating different monitored optical powers.

Preferably, the wavelength locking monitoring circuit 6 that separately compares a variation of a wavelength locking factor K0 with a corresponding threshold based on variations of the third optical power and the fourth optical power, and sends a comparison result to the wavelength locking control circuit 7 includes:

calculating a wavelength locking factor K1 based on an average value of measurement values of third optical powers of the first MPD and an average value of measurement values of fourth optical powers of the second MPD, where the average values are acquired when the wavelength locking control circuit 7 adjusts the temperature of the TEC by increasing the temperature of the TEC by preset a degrees Celsius and reducing the temperature of the TEC by preset a degrees Celsius, and determining whether a difference between the wavelength locking factor K1 and a wavelength locking factor K0 that is obtained in advance through calculation exceeds a threshold; if yes, calculating a wavelength locking factor K2 based on an average value of measurement values of third optical powers of the first MPD and an average value of measurement values of fourth optical powers of the second MPD, where the average values are acquired when the wavelength locking control circuit adjusts the temperature of the TEC by increasing the temperature of the TEC by preset b degrees Celsius and reducing the temperature of the TEC by preset b degrees Celsius, and determining whether a difference between the wavelength locking factor K2 and a wavelength locking factor K0 that is obtained through initial calculation exceeds a threshold; and if yes, determining that wavelengths of the forward emitted light and the backward emitted light that are emitted by the 10 G-DML drift, and enabling the wavelength locking control circuit to send, by using the TO pin, an instruction for adjusting the temperature of the TEC, and control a wavelength of the 10 G-DML to be aligned with the wavelength locking factor K0, where preset b degrees Celsius is greater than preset a degrees Celsius.

Based on the optical transmitter disclosed in this embodiment of the present invention, a BS is built in the narrowband optical filter 5, and one surface, which is in contact with the heat sink 2, of the narrowband optical filter 5 is machined to be at an oblique angle, and the narrowband optical filter 5 may also be an Etalon FILTER having an obliquely built-in BS; and the 10 G-DML may also be a 10 G-DFB.

The optical transmitter disclosed in Embodiment 5 of the present invention uses a tube core of a 10 G-DML into which an MPD 1 is integrated, and compared with an optical transmitter in Embodiment 1 of the present invention, the MPD 1 disclosed in Embodiment 5 of the present invention only needs to monitor a backlight power of the 10 G-DML, that is an optical power of a backward emitted light, and it does not need to be considered that the backlight power and an optical power of a backward reflected light of a narrowband optical filter complement each other. An MPD 2 disposed outside the 10 G-DML is used to independently monitor a reflected light, which is emitted by the narrowband optical filter that has a tilt angle with a heat sink, of a forward emitted light of the 10 G-DML. The optical transmitter disclosed in Embodiment 5 of the present invention also saves an optical isolator, a beam splitter, or the like in a TO, so that an inner structure of the TO is simple, making it easier to package and machine the TO while reducing a cost.

In addition, a wavelength locking monitoring circuit receives the third optical power and the fourth optical power by using a TO pin, separately compares a variation of a wavelength locking factor K0 with a corresponding threshold based on variations of the detected third optical power and the detected fourth optical power, and sends a comparison result to the wavelength locking control circuit, to enable the wavelength locking control circuit to adjust, according to the comparison result and by using the TO pin, a temperature of a TEC to perform wavelength alignment. Wavelength locking control is performed on a wavelength of a 10 G-DML into which the MPD 1 is integrated and the narrowband optical filter by using a novel wavelength monitor loop, so that the optical transmitter disclosed in this embodiment of the present invention can achieve an objective of a high modulation rate with a low cost and low power consumption, where a chirp phenomenon is reduced, thereby enabling the optical transmitter to be applied to a 10 G-PON currently and a higher-rate PON system in the future.

Embodiment 6

Based on an optical transmitter disclosed in Embodiment 5 of the present invention, based on the optical transmitter, this embodiment of the present invention further correspondingly discloses a wavelength alignment method. The method is based on a schematic structural diagram of an optical transmitter shown in FIG. 5, and mainly includes the following steps:

Step S202. According to a preset time interval and based on a current standard working point, control a wavelength locking control circuit to adjust a temperature of the TEC to increase preset a degrees Celsius and reduce preset a degrees Celsius, and acquire an average value of measurement values of third optical powers, which are obtained through two times of monitoring, of the first MPD, and an average value of measurement values of fourth optical powers, which are obtained through two times of monitoring, of the second MPD, to calculate a wavelength locking factor K1.

In step S202, increasing preset a degrees Celsius and reducing preset a degrees Celsius refer to a relatively small temperature deviation, that is, during performing of step S202, the wavelength locking control circuit is controlled to perform fine adjustment to increase or reduce the temperature of the TEC by a degrees Celsius, an average value of measurement values of third optical powers that are separately detected by the first MPD after two times of adjustment is acquired, an average value of measurement values of fourth optical powers that are separately detected by the second MPD after the two times of adjustment is acquired, subsequently, a ratio of the average value of the measurement values of the optical powers that are monitored by the first MPD in the two times to the average value of the measurement values of the optical powers that are monitored by the second MPD in the two times is calculated, and the ratio is used as the wavelength locking factor K1.

Step S203. Determine whether a difference between the wavelength locking factor K1 and a wavelength locking factor K0 that is obtained in advance through calculation exceeds a threshold; if not, go back to perform step S202; and if yes, perform step S204.

Step S204. Based on the current standard working point, control the wavelength locking control circuit to adjust the temperature of the TEC by increasing the temperature of the TEC by preset b degrees Celsius and reducing the temperature of the TEC by preset b degrees Celsius, and acquire an average value of the measurement values of the third optical powers, which are obtained through two times of monitoring, of the first MPD, and an average value of measurement values of the fourth optical powers, which are obtained through two times of monitoring, of the second MPD, to calculate a wavelength locking factor K2.

In step S204, increasing preset b degrees Celsius and reducing preset b degrees Celsius refer to a relatively great temperature deviation, where preset b degrees Celsius is greater than preset a degrees Celsius. During performing of step S202, the wavelength locking control circuit is controlled to perform great adjustment to increase or reduce the temperature of the TEC by b degrees Celsius, based on b degrees Celsius by which the temperature of the TEC is increased or reduced, an average value of measurement values of third optical powers that are separately detected by the first MPD after two times of adjustment is acquired, an average value of measurement values of fourth optical powers that are separately detected by the second MPD after the two times of adjustment is acquired, subsequently, a ratio of the average value of the measurement values of the optical powers that are monitored by the first MPD in the two times to the average value of the measurement values of the optical powers that are monitored by the second MPD in the two times is calculated, and the ratio is used as the wavelength locking factor K2.

Step S205. Determine whether a difference between the wavelength locking factor K2 and a wavelength locking factor K0 that is obtained through initial calculation exceeds a threshold; if not, go back to perform step S202; and if yes, perform step S206.

S206. Determine that wavelengths of a forward emitted light and a backward emitted light that are emitted by a 10 G-DML drift, and enable the wavelength locking control circuit to send, by using the TO pin, an instruction for adjusting the temperature of the TEC, and control a wavelength of the 10 G-DML to be aligned with the wavelength locking factor K0.

Figure 6:
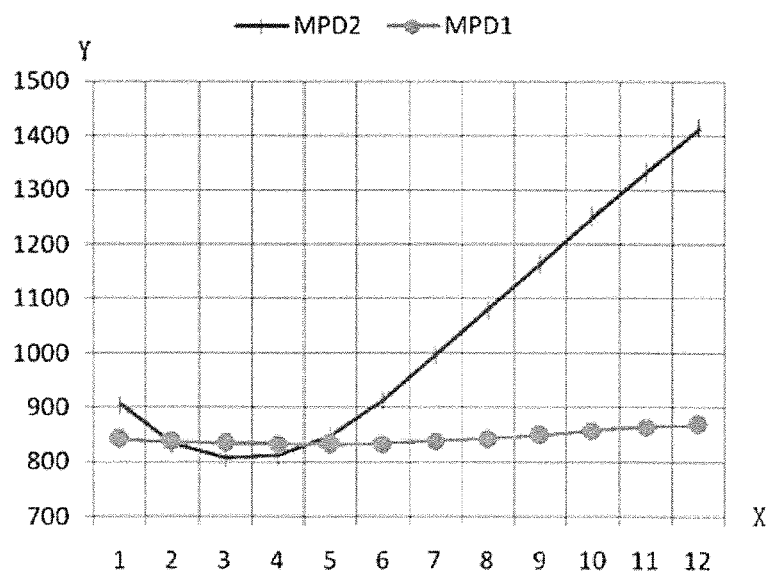
FIG. 6 is a curve comparison diagram of optical powers that are monitored by an MPD 1 and an MPD 2 in a wavelength alignment method according to Embodiment 6 of the present invention.

As shown in FIG. 6, during performing of the wavelength alignment method provide in Embodiment 6 of the present invention, an optical power monitored by an MPD 1 is proportional to an optical power of the forward emitted light of the 10 G-DML, and may be used as input of an automatic optical power control loop, an input end of the automatic optical power control loop is connected to the MPD 1 and an MPD2, and the MPD 2 monitors a reflected light of a narrowband optical filter, where an X-axis indicates a value of the temperature of the TEC, and an Y-axis indicates a value of an optical power that corresponds to the temperature of the TEC.

During performing of step S206, the enabling the wavelength locking control circuit to send, by using the TO pin, an instruction for adjusting the temperature of the TEC, and control a wavelength of the 10 G-DML to be aligned with the wavelength locking factor K0 specifically includes:

Step S2061. Based on the current standard working point, acquire measurement values of optical powers of the first MPD and the second MPD that are detected after the wavelength locking control circuit adjusts the temperature of the TEC, to calculate a wavelength locking factor K3, and determine whether the wavelength locking factor K3 is within a reference wavelength locking factor range; if yes, perform step S2062 or step S2063; and if the wavelength locking factor K3 is not within the reference wavelength locking factor range, continue to enable the wavelength locking control circuit to adjust the temperature of the TEC, until the wavelength locking factor K3 is within the reference wavelength locking factor range, where the reference wavelength locking factor range is [K0−K, K0+K'], and K and K' have a same value or have different values, and are both less than K0.

During performing of step S2061, the measurement values of the optical powers of the first MPD and the second MPD that are detected after the temperature of the TEC is adjusted are used to calculate the wavelength locking factor K3, and if the wavelength locking factor K3 is not within the reference wavelength locking factor range being [K0−K, K0+K'], adjustment of the temperature of the TEC is continued, until K3 is within the reference wavelength locking factor range. Specifically, step S2061 is performed to enable K3 to be infinitely close to K0.

Step S2062. Control the wavelength of the 10 G-DML to be aligned with the wavelength locking factor K0.

When step S2062 is performed, in fact, the wavelength of the 10 G-DML is controlled to be aligned with the wavelength locking factor K3, that is, K3 that is acquired during performing of step S2061 and is infinitely close to K0; and therefore, preferably, it may be considered that the wavelength of the 10 G-DML is controlled to be aligned with the wavelength locking factor K0.

Step S2063. When it is determined that the wavelength locking factor K3 within the reference wavelength locking factor range is less than the threshold, set a current temperature of the TEC, where the measurement values of the optical powers of the first MPD and the second MPD are values at a next standard working point, that is, a standard working point when step S202 is performed next time.

It should be noted that there is not a particular sequential order for performing step S2062 and step S2063.

Figure 7:
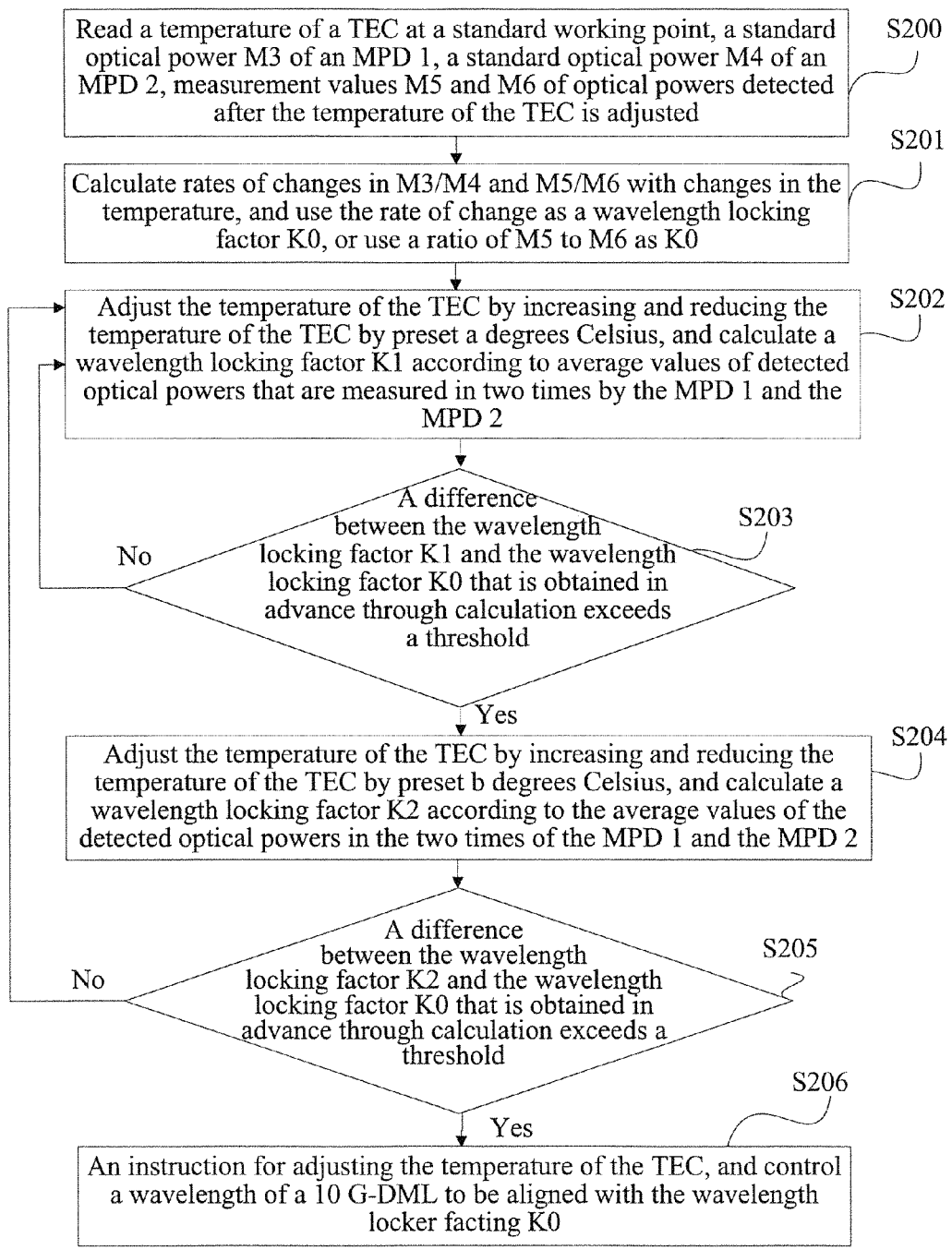
FIG. 7 is a flowchart of a wavelength alignment method according to Embodiment 6 of the present invention.

Moreover, as shown in FIG. 7, before step S202 to step S206 are performed, step S200 and step S201 of obtaining the wavelength locking factor K0 through calculation are first performed as follows. FIG. 6 shows a flowchart of an exemplary wavelength alignment method provided in Embodiment 6 of the present invention.

Step S200. The wavelength locking monitoring circuit reads a temperature of the TEC at the current standard working point, a measurement value M3 of a third standard optical power of the first MPD, and a measurement value M4 of a fourth standard optical power of the second MPD, and reads a measurement value M5 of an optical power of the first MPD and a measurement value M6 of an optical power of the second MPD, where the measurement values M5 and M6 are after the temperature of the TEC is adjusted by a preset temperature.

During performing of step S200, the measurement value M5 of the optical power of the first MPD and the measurement value M6 of the optical power of the second MPD are read, where the measurement values M5 and M6 are after the temperature of the TEC is adjusted by a preset temperature, where the preset temperature also belongs to a fine adjustment range, that is, may be the preset a degrees Celsius.

Step S201. Calculate rates of changes in M3/M4 and M5/M6 with changes in the temperature, and use the rate of change as the wavelength locking factor K0, or use a ratio of M5 to M6 as the wavelength locking factor K0.

Based on a novel wavelength monitor loop in an optical transmitter provided in Embodiment 5 of the present invention, and a corresponding wavelength alignment method provided in Embodiment 6 of the present invention, optical powers that are monitored by an MPD 1 and an MPD 2 are combined and input to a wavelength locking monitoring circuit through a TO pin, and subsequently, a temperature of a TEC is adjusted according to the foregoing disclosed wavelength alignment method and according to the optical powers that are detected by the MPD 1 and the MPD 2 to perform wavelength alignment. That is, by using the foregoing novel wavelength monitor loop and the wavelength alignment method that corresponds to the novel wavelength monitor loop, wavelength locking control is performed on a wavelength of a 10 G-DML into which the MPD 1 is integrated and a narrowband optical filter, so that the optical transmitter disclosed in this embodiment of the present invention can achieve an objective of a high modulation rate with a low cost and low power consumption, where a chirp phenomenon is reduced, thereby enabling the optical transmitter to be applied to a 10 G-PON currently and a higher-rate PON system in the future.

This embodiment of the present invention further discloses an optical transmitter, where similarly, a 10 G-DML, an MPD 1, an MPD 2, a collimation lens, and a narrowband optical filter are disposed in a TO; therefore, monitoring of an optical power can be achieved, and the optical transmitter disclosed in this embodiment of the present invention can achieve an objective of a high modulation rate with a low cost and low power consumption, where a chirp phenomenon is reduced, thereby enabling the optical transmitter to be applied to a 10 G-PON currently and a higher-rate PON system in the future, which is specifically described as follows.

Embodiment 7

Figure 8:
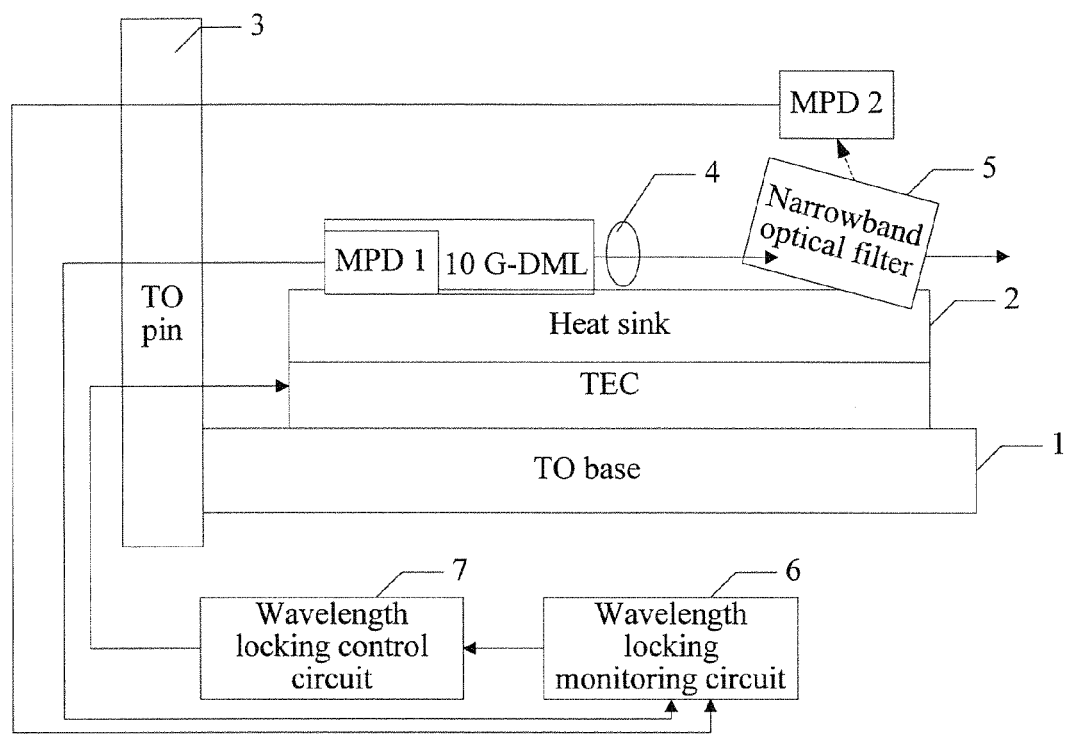
FIG. 8 is a schematic structural diagram of an optical transmitter according to Embodiment 7 of the present invention.

FIG. 8 is an optical transmitter according to Embodiment 7 of the present invention, mainly including:

a laser transmitter TO base 1, a TEC, and a heat sink 2 that are transverse and are connected sequentially from bottom to top;

a TO pin 3 whose one side is connected to one end of the TO base 1;

a first MPD (which is shown as an MPD 1 in FIG. 8), a 10 G-DML, a collimation lens 4, and a narrowband optical filter 5 that are disposed above the heat sink 2, where the MPD 1 is integrated into the 10 G-DML, the collimation lens 4 is located between the 10 G-DML and the narrowband optical filter 5, and one side, which faces the collimation lens 4, of the narrowband optical filter 5 is connected to the heat sink 2 at a preset tilt angle;

a second MPD (which is shown as an MPD 2 in FIG. 8) that is disposed above the narrowband optical filter 5 and connected to the narrowband optical filter 5; and a wavelength locking monitoring circuit 6 connected to the TO pin 3 disposed at one side of the TO base 1, and a wavelength locking control circuit 7 connected to the wavelength locking monitoring circuit 6, where a forward emitted light emitted by the 10 G-DML is input to the narrowband optical filter 4 through the collimation lens 5, and a backward emitted light emitted by the 10 G-DML is input to the MPD 1; and the narrowband optical filter 5 reflects a forward transmitted light, which is split from the forward emitted light, to the MPD 2 connected to the narrowband optical filter 5;

the MPD 1 receives and monitors a fifth optical power of the backward emitted light, and the MPD 2 receives and monitors a sixth optical power of the forward transmitted light; and the wavelength locking monitoring circuit 6 that receives the fifth optical power and the sixth optical power by using the TO pin 3 separately compares a variation of a wavelength locking factor K0 with a corresponding threshold based on variations of the fifth optical power and the sixth optical power, and sends a comparison result to the wavelength locking control circuit 7, to enable the wavelength locking control circuit 7 to adjust, according to the comparison result and by using the TO pin 3, a temperature of the TEC to perform wavelength alignment, where the wavelength locking factor K0 is a ratio of the fifth optical power to the sixth optical power or a difference between the fifth optical power and the sixth optical power.

It should be noted that "first", "second", "third", "fourth", "fifth", and "sixth" herein are used only for differentiating different monitored optical powers.

Preferably, the wavelength locking monitoring circuit 6 that separately compares a variation of a wavelength locking factor K0 with a corresponding threshold based on variations of the fifth optical power and the sixth optical power, and sends a comparison result to the wavelength locking control circuit includes:

the wavelength locking monitoring circuit being configured to: calculate a wavelength locking factor K4 based on an average value of measurement values of fifth optical powers of the first MPD and an average value of measurement values of sixth optical powers of the second MPD, where the average values are acquired when the wavelength locking control circuit adjusts the temperature of the TEC by increasing the temperature of the TEC by preset d degrees Celsius and reducing the temperature of the TEC by preset d degrees Celsius, and determine whether a difference between the wavelength locking factor K4 and a wavelength locking factor K0 that is obtained through initial calculation exceeds a threshold; if yes, calculate a wavelength locking factor K5 based on an average value of measurement values of fifth optical powers of the first MPD and an average value of measurement values of sixth optical powers of the second MPD, where the average values are acquired when the wavelength locking control circuit adjusts the temperature of the TEC by increasing the temperature of the TEC by preset e degrees Celsius and reducing the temperature of the TEC by preset e degrees Celsius, and determine whether a difference between the wavelength locking factor K5 and a wavelength locking factor K0 that is obtained through initial calculation exceeds a threshold; and if yes, determine that wavelengths of the forward emitted light and the backward emitted light that are emitted by the 10 G-DML drift, and enable the wavelength locking control circuit to send, by using the TO pin, an instruction for adjusting the temperature of the TEC, and control a wavelength of the 10 G-DML to be aligned with the wavelength locking factor K0, where preset e degrees Celsius is greater than preset d degrees Celsius.

Based on the optical transmitter disclosed in this embodiment of the present invention, a BS is built in the narrowband optical filter 5, and one surface, which is in contact with the heat sink 2, of the narrowband optical filter 5 is machined to be at an oblique angle, and the narrowband optical filter 5 may also be an Etalon FILTER having an obliquely built-in BS; and the 10 G-DML may also be a 10 G-DFB.

The optical transmitter disclosed in Embodiment 7 of the present invention also uses a tube core of a 10 G-DML into which an MPD 1 is integrated, and the MPD 1 disclosed in Embodiment 7 of the present invention also only needs to monitor a backlight power of the 10 G-DML, that is an optical power of a backward emitted light, and it does not need to be considered that the backlight power and an optical power of a backward reflected light of a narrowband optical filter complement each other. A difference between Embodiment 7 of the present invention and Embodiment 5 of the present invention lies in that, Embodiment 7 of the present invention uses an MPD 2 that is disposed above a narrowband optical filter and is connected to the narrowband optical filter, to independently monitors a partial optical power, which is emitted by the narrowband optical filter that has a tilt angle with a heat sink, in a forward emitted light of the 10 G-DML, that is, an optical power of a forward transmitted light that is split from the forward emitted light. The optical transmitter disclosed in Embodiment 7 of the present invention also saves an optical isolator, a beam splitter, or the like in a TO, so that an inner structure of the TO is simple, making it easier to package and machine the TO while reducing a cost.

In addition, a wavelength locking monitoring circuit receives the fifth optical power and the sixth optical power by using a TO pin, separately compares a variation of a wavelength locking factor K0 with a corresponding threshold based on variations of the fifth optical power and the sixth optical power, and sends a comparison result to the wavelength locking control circuit, to enable the wavelength locking control circuit to adjust, according to the comparison result and by using the TO pin, a temperature of a TEC to perform wavelength alignment. Wavelength locking control is performed on a wavelength of a 10 G-DML into which the MPD 1 is integrated and the narrowband optical filter by using a novel wavelength monitor loop, so that the optical transmitter disclosed in this embodiment of the present invention can achieve an objective of a high modulation rate with a low cost and low power consumption, where a chirp phenomenon is reduced, thereby enabling the optical transmitter to be applied to a 10 G-PON currently and a higher-rate PON system in the future.

Embodiment 8

Figure 9:
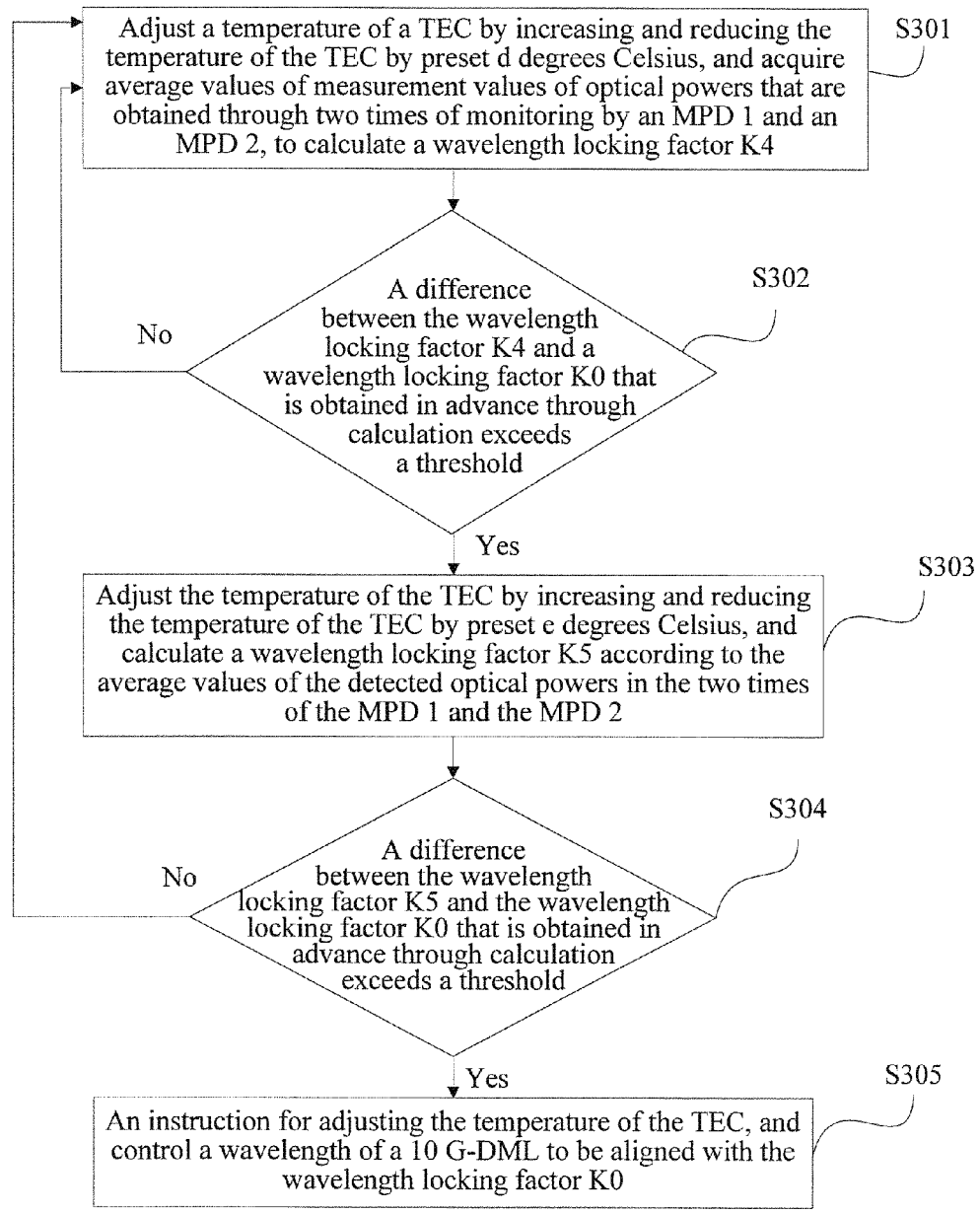
FIG. 9 is a flowchart of a wavelength alignment method according to Embodiment 8 of the present invention.

Based on an optical transmitter disclosed in Embodiment 7 of the present invention, based on the optical transmitter, this embodiment of the present invention further correspondingly discloses a wavelength alignment method. The method is based on a schematic structural diagram of an optical transmitter shown in FIG. 8, and as shown in FIG. 9, the wavelength alignment method mainly includes the following steps:

Step S301. According to a preset time interval and based on an initial working point, control a wavelength locking control circuit to adjust a temperature of the TEC to increase preset d degrees Celsius and reduce preset d degrees Celsius, and acquire an average value of measurement values of fifth optical powers, which are obtained through two times of monitoring, of the first MPD, and an average value of measurement values of sixth optical powers, which are obtained through two times of monitoring, of the second MPD, to calculate a wavelength locking factor K4.

Step S302. Determine whether a difference between the wavelength locking factor K4 and a wavelength locking factor K0 that is obtained through initial calculation exceeds a threshold; if not, go back to perform step S301; and if yes, perform step S303.

Step S303. Based on the initial working point, control the wavelength locking control circuit to adjust the temperature of the TEC by increasing the temperature of the TEC by preset e degrees Celsius and reducing the temperature of the TEC by preset e degrees Celsius, and acquire an average value of the measurement values of the fifth optical powers, which are obtained through two times of monitoring, of the first MPD, and an average value of the measurement values of the sixth optical powers, which are obtained through two times of monitoring, of the second MPD, to calculate a wavelength locking factor K5, where preset e degrees Celsius is greater than preset d degrees Celsius.

Step S304. Determine whether a difference between the wavelength locking factor K5 and a wavelength locking factor K0 that is obtained through initial calculation exceeds a threshold; if not, go back to perform step S301; and if yes, perform step S305.

Step S305. Determine that wavelengths of a forward emitted light and a backward emitted light that are emitted by a 10 G-DML drift, and enable the wavelength locking control circuit to send, by using the TO pin, an instruction for adjusting the temperature of the TEC, and control a wavelength of the 10 G-DML to be aligned with the wavelength locking factor K0.

During performing of step S305, the enabling the wavelength locking control circuit to send, by using the TO pin, an instruction for adjusting the temperature of the TEC, and control a wavelength of the 10 G-DML to be aligned with the wavelength locking factor K0 specifically includes:

Step S3051. Based on the initial working point, acquire the measurement values of the fifth optical power of the first MPD and the sixth optical power of the second MPD to calculate a wavelength locking factor K6, where the fifth optical power and the sixth optical power are detected after the wavelength locking control circuit adjusts the temperature of the TEC, and determine whether the wavelength locking factor K6 is within a reference wavelength locking factor range, if yes, perform step S3052, and if the wavelength locking factor K6 is not within the reference wavelength locking factor range, continue to enable the wavelength locking control circuit to adjust the temperature of the TEC, until the wavelength locking factor K6 is within the reference wavelength locking factor range, where the reference wavelength locking factor range is [K0−K, K0+K'], and K and K' have a same value or have different values, and are both less than K0.

During performing of step S3051, the measurement values of the fifth optical power of the first MPD and the sixth optical power of the second MPD that are detected after the temperature of the TEC is adjusted are used to calculate the wavelength locking factor K6, and if the wavelength locking factor K6 is not within the reference wavelength locking factor range being [K0−K, K0+K'], adjustment of the temperature of the TEC is continued, until K6 is within the reference wavelength locking factor range. Specifically, step S3051 is performed to enable K6 to be infinitely close to K0.

Step S3052. Control the wavelength of the 10 G-DML to be aligned with the wavelength locking factor K0.

When step S3052 is performed, in fact, the wavelength of the 10 G-DML is controlled to be aligned with the wavelength locking factor K6, that is, K6 that is acquired during performing of step S3051 and is infinitely close to K0; and therefore, preferably, it may be considered that the wavelength of the 10 G-DML is controlled to be aligned with the wavelength locking factor K0.

It should be noted that, the foregoing obtaining a wavelength locking factor K0 through initial calculation is: calculating a wavelength locking factor K0 according to a TEC that has a determined temperature and that is obtained by initializing the 10 G-DFB, and the measurement values of the optical powers of the first MPD and the second MPD.

A process of the initializing the 10 G-DML mainly includes:

Step S401. Test a correspondence between a power P and a drive current I of the tube core of the DML, and set an initial bias current Ib and a modulation current Im of the DML according to the correspondence.

Step S402. In a case of adding a 10 G-signal, scan the temperature of the TEC, and search for a greatest power value of the 10 G-DML.

Step S403. Increase the temperature of the TEC according to the greatest power value, and measure a current optical output power, an extinction ratio ER, and an eye pattern;

Step S404. When the current optical output power is greater than 2 dBm, determine that a corresponding temperature of the TEC is a lower limit initial value of an effective wavelength region of the narrowband optical filter.

Step S405. When the extinction ratio ER is greater than a preset ratio, and the eye pattern meets a standard mask, determine that the corresponding temperature of the TEC is an upper limit initial value of the effective wavelength region of the narrowband optical filter.

The preset ratio mentioned in step S405 is preferably 8.2 dB or 6 dB. The standard mask herein refers to a test template requirement in a communications protocol standard on an eye pattern at a transmit end, and the eye pattern should meet an index of the mask template.

Step S406. Within a range formed by the upper limit initial value and the lower limit initial value, measuring whether sensitivity of a boundary point and an intermediate zone of the range is less than preset sensitivity; if yes, perform step S407; and if not, pedant' step S408.

A value of the preset sensitivity mentioned in step S406 is preferably −28 dBm.

Step S407. Set a middle point in the range formed by the upper limit initial value and the lower limit initial value as an initial working point, and preliminarily determine that an initial status of the 10 G-DML includes the temperature of the TEC at the initial working point, and the measurement values of the fifth optical power of the first MPD and the sixth optical power of the second MPD.

Step S408. Based on the boundary point, narrow the boundary point of the effective wavelength region inwards, until it is found through measurement that sensitivity of a narrowed boundary point and the intermediate zone is less than the preset sensitivity.

During performing of the wavelength alignment method disclosed in Embodiment 8 of the present invention, during initialization of a 10 G-DML into which an MPD 1 is integrated, debugging is performed on a temperature of a TEC to set the 10 G-DML to be aligned with an effective wavelength region of a narrowband optical filter. A wavelength locking monitoring circuit combines an optical power, that is monitored by the MPD 1, of a backward emitted light of the 10 G-DML with a partial optical power, which is monitored by an MPD 2 and is received by a narrowband optical filter, in a forward emitted light, that is an optical power of a forward transmitted light. In the wavelength alignment method disclosed in Embodiment 8 of the present invention, the wavelength locking monitoring circuit adjusts, according to the foregoing disclosed wavelength alignment method and according to the optical powers that are detected by the MPD 1 and the MPD 2, the temperature of the TEC to perform wavelength alignment.

Figure 10:
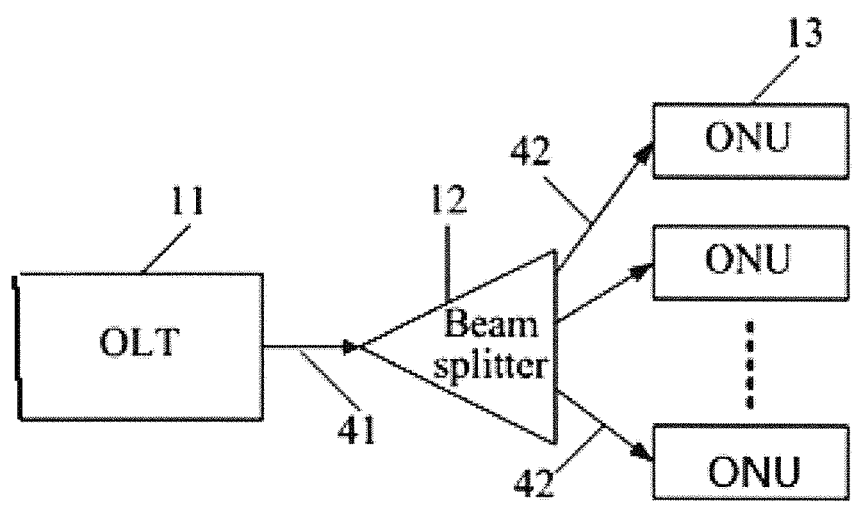
FIG. 10 is a schematic structural diagram of a passive optical network system according to an embodiment of the present invention.

Based on the optical transmitter disclosed in this embodiment of the present invention, and the wavelength alignment method corresponding to the optical transmitter, this embodiment of the present invention further correspondingly discloses a passive optical network system, which, as shown in FIG. 10, mainly includes: an OLT 11, a beam splitter 12, an ONU 13, and an optical fiber, where the optical fiber includes: a feeder optical fiber 41 and a distribution optical fiber 42; and the OLT 11 includes any optical transmitter disclosed in the embodiments of the present invention;

one end of the feeder optical fiber 41 is connected to the OLT 11, and the other end is connected to the beam splitter 12;

the beam splitter 12 is connected to the feeder optical fiber 41 to form an optical distribution network ODN; and multiple optical network units ONUs 13 are connected to the beam splitter 12 by using the distribution optical fiber 42, and are connected to the OLT 11 (central office) by using the feeder optical fiber 41 and after being aggregated; and the ONUs 13 share the feeder optical fiber 41 in a TDMA manner.

To sum up, for an optical transmitter and a wavelength alignment method that corresponds to the optical transmitter, and a passive optical network system having the optical transmitter disposed that are disclosed in the foregoing embodiments of the present invention, a novel wavelength monitor loop is used to achieve wavelength locking control of a wavelength of a 10 G-DML and a narrowband optical filter, so that the optical transmitter disclosed in the embodiments of the present invention can achieve an objective of a high modulation rate with a low cost and low power consumption, where a chirp phenomenon is reduced, thereby enabling the optical transmitter to be applied to a 10 G-PON currently and a higher-rate PON system in the future.

The embodiments in this specification are all described in a progressive manner, for same or similar parts in the embodiments, reference may be made to these embodiments, and each embodiment focuses on a difference from other embodiments. The apparatus disclosed in the embodiment is basically similar to the method disclosed in the embodiment, and therefore is described briefly; for related parts, reference may be made to partial descriptions of the method.

In combination with the embodiments disclosed in this specification, method or algorithm steps may be implemented by hardware, a software module executed by a processor, or a combination thereof. The software module may be disposed in a random access memory (RAM), a memory, a read-only memory (ROM), an electrically programmable ROM, an electrically erasable programmable ROM, a register, a hard disk, a removable disk, a CD-ROM, or a storage medium in any other focus well-known in the art.

The foregoing description of the disclosed embodiments enables a person skilled in the art to implement or use the present invention. Various modifications to the embodiments are obvious to the person skilled in the art, and general principles defined in this specification may be implemented in other embodiments without departing from the spirit or scope of the present invention. Therefore, the present invention will not be limited to the embodiments described in this specification but extends to the widest scope that complies with the principles and novelty disclosed in this specification.

What is claimed is:

1. An optical transmitter, comprising:
   a transmitter optical (TO) base, a thermoelectric cooler (TEC), and a heat sink that are transverse and are connected sequentially from bottom to top;
   a second monitor photodiode detector (MPD), a 10 G-directly modulated laser (G-DML), a collimation lens, and a narrowband optical filter that are disposed above the heat sink, wherein the second MPD and the collimation lens are located at two sides of the 10 G-DML, and the narrowband optical filter is located at one side of the collimation lens, and one surface, which faces the collimation lens, of the narrowband optical filter is connected to the heat sink at a preset tilt angle;
   a first MPD disposed above the narrowband optical filter;
   a wavelength locking monitoring circuit connected to a TO pin disposed at one side of the TO base, and a wavelength locking control circuit connected to the wavelength locking monitoring circuit;
   wherein a forward emitted light emitted by the 10 G-DML is input to the narrowband optical filter through the collimation lens, and the narrowband optical filter splits the forward emitted light into a forward transmitted light and a backward reflected light, transmits, at a preset elevation angle, the backward reflected light to the second MPD, and partially reflects the forward transmitted light to the first MPD connected to the narrowband optical filter;
   wherein the first MPD is configured to receive and monitor a first optical power of the forward transmitted light, and the second MPD is configured to receive and monitor a second optical power that is after the backward emitted light and the backward reflected light complement each other; and
   wherein the wavelength locking monitoring circuit is configured to receive the first optical power and the second optical power by using the TO pin, separately compare detected variations of the first optical power and the second optical power and a variation of a wavelength locking factor K0 with corresponding thresholds, and send a comparison result to the wavelength locking control circuit, to enable the wavelength locking control circuit to adjust, according to the comparison result and by using the TO pin, a temperature of the TEC to perform wavelength alignment, wherein the wavelength locking factor K0 is a ratio of the first optical power to the second optical power or a difference between the first optical power and the second optical power.

2. The optical transmitter according to claim 1, wherein the wavelength locking monitoring circuit is configured to:
   when the variations of the first optical power and the second optical power and the variation of the wavelength locking factor K0 exceed the corresponding thresholds, compare the first optical power with a first optical power detected last time, and compare the second optical power with a second optical power detected last time, and if the first optical power is less than the first optical power detected last time, and the second optical power is greater than the second optical power detected last time, obtain a first comparison result, and send the first comparison result to the wavelength locking control circuit; otherwise, obtain a second comparison result, and send the second comparison result to the wavelength locking control circuit, wherein the first comparison result is that wavelengths of the forward emitted light and the backward emitted light that are emitted by the 10 G-DML drift towards a longer wave, and wherein the second comparison result is that wavelengths of the forward emitted light and the backward emitted light that are emitted by the 10 G-DML drift towards a shorter wave.

3. The optical transmitter according to claim 2, wherein the wavelength locking control circuit is further configured to:
   when the first comparison result is received, send, by using the TO pin, an instruction for reducing the temperature of the thermoelectric cooler TEC, and control a wavelength of the 10 G-DML to be aligned with the wavelength locking factor K0; or
   when the second comparison result is received, send, by using the TO pin, an instruction for increasing the temperature of the TEC, and control a wavelength of the 10 G-DML to be aligned with the wavelength locking factor K0.

4. A wavelength alignment method for use with an optical transmitter, the method comprising:

receiving, by a wavelength locking monitoring circuit by using a transmitter optical (TO) pin, a first optical power, which is monitored by a first monitor photodiode detector (MPD), of a forward transmitted light, and a second optical power that is monitored by a second MPD and that is after a backward emitted light and a backward reflected light complement each other, and using a ratio of the first optical power to the second optical power or a difference between the first optical power and the second optical power as a wavelength locking factor K0;

monitoring, by the wavelength locking monitoring circuit, whether variations of the first optical power and second optical power and a variation of the wavelength locking factor K0 exceed corresponding thresholds; and when the variations of the first optical power and the second optical power and the variation of the wavelength locking factor K0 exceed the corresponding thresholds, comparing the first optical power with a first optical power detected last time, comparing the second optical power with a second optical power detected last time, sending a comparison result to a wavelength locking control circuit, and adjusting, by the wavelength locking control circuit, according to the comparison result and by using the TO pin, a temperature of a thermoelectric cooler (TEC) to perform wavelength alignment.

5. The method according to claim 4, before receiving, by a wavelength locking monitoring circuit by using a TO pin, a first optical power, which is monitored by a first MPD, of a forward transmitted light, and a second optical power that is monitored by a second MPD and that is after a backward emitted light and a backward reflected light complement each other, the method further comprises:

reading, by the wavelength locking monitoring circuit, a temperature of the TEC at a standard working point, a first standard optical power M1 of the first MPD, and a second standard optical power M2 of the second MPD, calculating an average optical power (Pa) with t*M1+M2 in a preset effective wavelength region, and using the calculated Pa as input of an automatic optical power control loop, wherein an input end of the automatic optical power control loop is connected to the first MPD or the second MPD, and t is a preset proportion coefficient.

6. The method according to claim 4, wherein comparing the first optical power with a first optical power detected last time, comparing the second optical power with a second optical power detected last time, sending a comparison result to the wavelength locking control circuit, and adjusting, by the wavelength locking control circuit, according to the comparison result and by using the TO pin, a temperature of a thermoelectric cooler (TEC) comprises:

comparing the first optical power with the first optical power detected last time, and comparing the second optical power with the second optical power detected last time;

if the first optical power is less than the first optical power detected last time, and the second optical power is greater than the second optical power detected last time, obtaining a first comparison result, wherein the first comparison result is that wavelengths of a forward emitted light and a backward emitted light that are emitted by a 10 G-directly modulated laser (G-DML) drift towards a longer wave;

sending the obtained first comparison result to the wavelength locking control circuit, to enable the wavelength locking control circuit to send, by using the TO pin, an instruction for reducing the temperature of the TEC, and control a wavelength of the 10 G-DML to be aligned with the wavelength locking factor K0, wherein the wavelength locking factor K0 is a ratio of the current first optical power to the current second optical power or a difference between the current first optical power and the current second optical power;

otherwise, obtaining a second comparison result, wherein the second comparison result is that wavelengths of a forward emitted light and a backward emitted light that are emitted by the 10 G-DML drift towards a shorter wave; and sending the obtained second comparison result to the wavelength locking control circuit, to enable the wavelength locking control circuit to send, by using the TO pin, an instruction for increasing the temperature of the TEC, and control a wavelength of the 10 G-DML to be aligned with the wavelength locking factor K0, wherein the wavelength locking factor K0 is a ratio of the current first optical power to the current second optical power or a difference between the current first optical power and the current second optical power.

7. An optical transmitter, comprising:

a transmitter optical (TO) base, a thermoelectric cooler (TEC), and a heat sink that are transverse and are connected sequentially from bottom to top;

a first monitor photodiode (MPD), a 10 G-directly modulated laser (G-DML), a collimation lens, and a narrowband optical filter that are disposed above the heat sink, wherein the first MPD is integrated into the 10 G-DML, the collimation lens is located between the 10 G-DML and the narrowband optical filter, and one side, which faces the collimation lens, of the narrowband optical filter is connected to the heat sink at a preset tilt angle;

a second MPD disposed above the 10 G-DML into which the first MPD is integrated;

a wavelength locking monitoring circuit connected to a TO pin disposed at one side of the TO base, and a wavelength locking control circuit connected to the wavelength locking monitoring circuit;

wherein when a forward emitted light emitted by the 10 G-DML is input to the narrowband optical filter through the collimation lens and a backward emitted light emitted by the 10 G-DML laser is input to the first MPD, the narrowband optical filter reflects, at a preset elevation angle, the forward emitted light to the second MPD;

wherein the first MPD is configured to receive and monitor a third optical power of the backward emitted light, and the second MPD is configured to receive and monitor a fourth optical power of a reflected light of the narrowband optical filter; and wherein the wavelength locking monitoring circuit is configured to receive the third optical power and the fourth optical power by using the TO pin, separately compare a variation of a wavelength locking factor K0 with a corresponding threshold based on variations of the third optical power and the fourth optical power, and send a comparison result to the wavelength locking control circuit, to enable the wavelength locking control circuit to adjust, according to the comparison result and by using s TO pin, a temperature of the TEC to perform wavelength alignment, wherein the wavelength locking factor K0 is a ratio of the third optical power to the fourth optical power or a difference between the third optical power and the fourth optical power.

8. The optical transmitter according to claim 7, wherein the wavelength locking monitoring circuit is configured to:
calculate a wavelength locking factor K1 based on an average value of measurement values of third optical powers of the first MPD and an average value of measurement values of fourth optical powers of the second MPD, wherein the average values are acquired when the wavelength locking control circuit adjusts the temperature of the TEC by increasing the temperature of the TEC by a preset a degrees Celsius and reducing the temperature of the TEC by a preset a degrees Celsius;
determine whether a first difference between the wavelength locking factor K1 and a wavelength locking factor K0 that is obtained in advance through calculation exceeds a first threshold;
if the first different exceeds the first threshold, calculate a wavelength locking factor K2 based on an average value of measurement values of third optical powers of the first MPD and an average value of measurement values of fourth optical powers of the second MPD, wherein the average values are acquired when the wavelength locking control circuit adjusts the temperature of the TEC by increasing the temperature of the TEC by a preset b degrees Celsius and reducing the temperature of the TEC by a preset b degrees Celsius;
determine whether a second difference between the wavelength locking factor K2 and a wavelength locking factor K0 that is obtained through initial calculation exceeds a second threshold;
if the second different exceeds the second threshold, determine that wavelengths of the forward emitted light and the backward emitted light that are emitted by the 10 G-DML drift, and enable the wavelength locking control circuit to send, by using the TO pin, an instruction for adjusting the temperature of the TEC, and control a wavelength of the 10 G-DML to be aligned with the wavelength locking factor K0; and
wherein the preset b degrees Celsius is greater than the preset a degrees Celsius.

9. A wavelength alignment method for use with an optical transmitter, the method comprising:
according to a preset time interval and based on a current standard working point, controlling a wavelength locking control circuit to adjust a temperature of a thermoelectric cooler (TEC) to increase a preset a degrees Celsius and reduce a preset a degrees Celsius, and acquiring an average value of measurement values of third optical powers, which are obtained through two times of monitoring, of a first monitor photodiode (MPD), and an average value of measurement values of fourth optical powers, which are obtained through two times of monitoring, of s second MPD, to calculate a wavelength locking factor K1;
determining whether a first difference between the wavelength locking factor K1 and a wavelength locking factor K0 that is obtained in advance through calculation exceeds a first threshold;
if the first difference exceeds the first threshold, based on the current standard working point, controlling the wavelength locking control circuit to adjust the temperature of the TEC by increasing the temperature of the TEC by a preset b degrees Celsius and reducing the temperature of the TEC by a preset b degrees Celsius, and acquiring an average value of the measurement values of the third optical powers, which are obtained through two times of monitoring, of the first MPD, and an average value of measurement values of the fourth optical powers, which are obtained through two times of monitoring, of the second MPD, to calculate a wavelength locking factor K2, wherein the preset b degrees Celsius is greater than the preset a degrees Celsius;
determining whether a second difference between the wavelength locking factor K2 and a wavelength locking factor K0 that is obtained through initial calculation exceeds a second threshold;
if the second difference exceeds the second threshold, determining that wavelengths of a forward emitted light and a backward emitted light that are emitted by a 10 G-directly modulated laser (G-DML) drift, and enabling the wavelength locking control circuit to send, by using a transmitter optical (TO) pin, an instruction for adjusting the temperature of the TEC, and control a wavelength of the 10 G-DML to be aligned with the wavelength locking factor K0.

10. The method according to claim 9, wherein the wavelength locking factor K0 is generated by;
reading, by the wavelength locking monitoring circuit, a temperature of the TEC at the current standard working point, a measurement value M3 of a third standard optical power of the first MPD, and a measurement value M4 of a fourth standard optical power of the second MPD, and reading a measurement value M5 of an optical power of the first MPD and a measurement value M6 of an optical power of the second MPD, wherein the measurement values M5 and M6 are after the temperature of the TEC is adjusted by a preset temperature; and
calculating rates of changes in M3/M4 and M5/M6 with changes in the temperature, and using the rate of change as the wavelength locking factor K0, or using a ratio of M5 to M6 as the wavelength locking factor K0.

11. The method according to claim 9, wherein enabling the wavelength locking control circuit to send, by using the TO pin, an instruction for adjusting the temperature of the TEC, and control a wavelength of the 10 G-DML to be aligned with the wavelength locking factor K0 comprises:
based on the current standard working point, acquiring measurement values of optical powers of the first MPD and the second MPD that are detected after the wavelength locking control circuit adjusts the temperature of the TEC, to calculate a wavelength locking factor K3;
if the wavelength locking factor K3 is not within a reference wavelength locking factor range, continuing to enable the wavelength locking control circuit to adjust the temperature of the TEC, until the wavelength locking factor K3 is within the reference wavelength locking factor range, wherein the reference wavelength locking factor range is [K0−K, K0+K'], and K and K' have a same value or have different values, and are both less than K0;
controlling the wavelength of the 10 G-DML to be aligned with the wavelength locking factor K0; and
if the wavelength locking factor K3 is within the reference wavelength locking factor range and is less than the threshold, setting a current temperature of the TEC, wherein the measurement values of the optical powers of the first MPD and the second MPD are values at a next standard working point.

12. An optical transmitter, comprising:
a transmitter optical (TO) base, a thermoelectric cooler (TEC), and a heat sink that are transverse and are connected sequentially from bottom to top;
a first monitor photodiode (MPD), a 10 G-directly modulated laser (G-DML, a collimation lens, and a narrowband optical filter that are disposed above the heat sink, wherein the first MPD is integrated into the 10 G-DML, the collimation lens is located between the 10 G-DML and the narrowband optical filter, and one side, which faces the collimation lens, of the narrowband optical filter is connected to the heat sink at a preset tilt angle;
a second MPD that is disposed above the narrowband optical filter and connected to the narrowband optical filter;
a wavelength locking monitoring circuit connected to a TO pin disposed at one side of the TO base, and a wavelength locking control circuit connected to the wavelength locking monitoring circuit;
wherein when a forward emitted light emitted by the 10 G-DML laser is input to the narrowband optical filter through the collimation lens, and a backward emitted light emitted by the 10 G-DML is input to the first MPD, the narrowband optical filter reflects a forward transmitted light, which is split from the forward emitted light, to the second MPD connected to the narrowband optical filter;
wherein the first MPD is configured to receive and monitor a fifth optical power of the backward emitted light, and the second MPD is configured to receive and monitor a sixth optical power of the forward transmitted light; and
wherein the wavelength locking monitoring circuit is configured to receive the fifth optical power and the sixth optical power by using the TO pin, separately compare a variation of a wavelength locking factor K0 with a corresponding threshold based on variations of the fifth optical power and the sixth optical power, and send a comparison result to the wavelength locking control circuit, to enable the wavelength locking control circuit to adjust, according to the comparison result and by using the TO pin, a temperature of the TEC to perform wavelength alignment.

13. The optical transmitter according to claim 12, wherein the wavelength locking monitoring circuit is further configured to:
calculate a wavelength locking factor K4 based on an average value of measurement values of fifth optical powers of the first MPD and an average value of measurement values of sixth optical powers of the second MPD, wherein the average values are acquired when the wavelength locking control circuit adjusts the temperature of the TEC by increasing the temperature of the TEC by preset d degrees Celsius and reducing the temperature of the TEC by a preset d degrees Celsius;
determine whether a first difference between the wavelength locking factor K4 and a wavelength locking factor K0 that is obtained through initial calculation exceeds a first threshold;
if the first difference exceeds the first threshold, calculate a wavelength locking factor K5 based on an average value of measurement values of fifth optical powers of the first MPD and an average value of measurement values of sixth optical powers of the second MPD, wherein the average values are acquired when the wavelength locking control circuit adjusts the temperature of the TEC by increasing the temperature of the TEC by a preset e degrees Celsius and reducing the temperature of the TEC by a preset e degrees Celsius;
determine whether a second difference between the wavelength locking factor K5 and a wavelength locking factor K0 that is obtained through initial calculation exceeds a second threshold;
if the second difference exceeds the second threshold, determine that wavelengths of the forward emitted light and the backward emitted light that are emitted by the 10 G-DML drift, and enable the wavelength locking control circuit to send, by using the TO pin, an instruction for adjusting the temperature of the TEC, and control a wavelength of the 10 G-DML to be aligned with the wavelength locking factor K0; and
wherein the preset e degrees Celsius is greater than the preset d degrees Celsius.

14. A wavelength alignment method for use with an optical transmitter, the method comprising:
according to a preset time interval and based on an initial working point, controlling a wavelength locking control circuit to adjust a temperature of a thermoelectric cooler (TEC) to increase a preset d degrees Celsius and reduce a preset d degrees Celsius, and acquiring an average value of measurement values of fifth optical powers, which are obtained through two times of monitoring, of the first MPD, and an average value of measurement values of sixth optical powers, which are obtained through two times of monitoring, of the second MPD, to calculate a wavelength locking factor K4;
determining whether a first difference between the wavelength locking factor K4 and a wavelength locking factor K0 that is obtained through initial calculation exceeds a first threshold; and
if the first difference exceeds the first threshold, based on the initial working point, controlling the wavelength locking control circuit to adjust the temperature of the TEC by increasing the temperature of the TEC by a preset e degrees Celsius and reducing the temperature of the TEC by a preset e degrees Celsius, and acquiring an average value of the measurement values of the fifth optical powers, which are obtained through two times of monitoring, of the first MPD, and an average value of the measurement values of the sixth optical powers, which are obtained through two times of monitoring, of the second MPD, to calculate a wavelength locking factor K5, wherein the preset e degrees Celsius is greater than the preset d degrees Celsius;
determining whether a second difference between the wavelength locking factor K5 and a wavelength locking factor K0 that is obtained through initial calculation exceeds a second threshold; and
if the second difference exceeds the second threshold, determining that wavelengths of a forward emitted light and a backward emitted light that are emitted by a 10 G-directly modulated laser (G-DML) drift, and enabling the wavelength locking control circuit to send, by using a transmitter optical (TO) pin, an instruction for adjusting the temperature of the TEC, and control a wavelength of the 10 G-DML to be aligned with the wavelength locking factor K0.

15. The method according to claim 14, wherein the wavelength locking factor K0 is generated by:
calculating the wavelength locking factor K0 according to a TEC that has a determined temperature obtained by initializing the 10 G-DML, and the measurement values of the fifth optical power of the first MPD and the sixth optical power of the second MPD; and wherein initializing the 10 G-DML comprises:
testing a correspondence between a power P of a tube core of the 10 G-DML and a drive current I, and setting an initial bias current Ib and a modulation current Im of the 10 G-DML according to the correspondence,
in a case of adding a 10 G-signal, scanning the temperature of the TEC, and searching for a greatest power value of the 10 G-DML,
increasing the temperature of the TEC according to the greatest power value, and measuring a current optical output power, an extinction ratio (ER), and an eye pattern,
when the current optical output power is greater than 2 dBm, determining that a corresponding temperature of the TEC is a lower limit initial value of an effective wavelength region of the narrowband optical filter,
when the extinction ratio ER is greater than a preset ratio, and the eye pattern meets a standard mask, determining that the corresponding temperature of the TEC is an upper limit initial value of the effective wavelength region of the narrowband optical filter,
within a range formed by the upper limit initial value and the lower limit initial value, measuring whether sensitivity of a boundary point and an intermediate zone of the range is less than a preset sensitivity,
if sensitivity is less than the preset sensitivity, setting a middle point in the range formed by the upper limit initial value and the lower limit initial value as an initial working point, and preliminarily determining that an initial status of the 10 G-DML comprises the temperature of the TEC at the initial working point, and the measurement values of the fifth optical power of the first MPD and the sixth optical power of the second MPD, and
if sensitivity is not less than the preset sensitivity, based on the boundary point, narrowing the boundary point of the effective wavelength region inwards, until it is found through measurement that sensitivity of a narrowed boundary point and the intermediate zone is less than the preset sensitivity.

16. The method according to claim 14, wherein enabling the wavelength locking control circuit to send, by using the TO pin, an instruction for adjusting the temperature of the TEC, and control a wavelength of the 10 G-DML to be aligned with the wavelength locking factor K0 comprises:
based on the initial working point, acquiring the measurement values of the fifth optical power of the first MPD and the sixth optical power of the second MPD to calculate a wavelength locking factor K6, wherein the fifth optical power and the sixth optical power are detected after the wavelength locking control circuit adjusts the temperature of the TEC, and if the wavelength locking factor K6 is not within a reference wavelength locking factor range, continuing to enable the wavelength locking control circuit to adjust the temperature of the TEC, until the wavelength locking factor K6 is within the reference wavelength locking factor range, wherein the reference wavelength locking factor range is [K0−K, K0+K'], and K and K' have a same value or have different values, and are both less than K0; and
controlling the wavelength of the 10 G-DML to be aligned with the wavelength locking factor K0.

17. A passive optical network system, comprising:
an optical line terminal (OLT) comprising an optical transmitter;
a beam splitter;
an optical network unit (ONU);
an optical fiber comprising a feeder optical fiber and a distribution optical fiber wherein one end of the feeder optical fiber is connected to the OLT and another end of the feeder optical fiber is connected to the beam splitter to form an optical distribution network (ODN); and
wherein the optical transmitter comprises:
a transmitter optical (TO) base, a thermoelectric cooler (TEC), and a heat sink that are transverse and are connected sequentially from bottom to top,
a second monitor photodiode detector (MPD), a 10 G-directly modulated laser (G-DML), a collimation lens, and a narrowband optical filter that are disposed above the heat sink, wherein the second MPD and the collimation lens are located at two sides of the 10 G-DML, and the narrowband optical filter is located at one side of the collimation lens, and one surface, which faces the collimation lens, of the narrowband optical filter is connected to the heat sink at a preset tilt angle,
a first MPD disposed above the narrowband optical filter,
a wavelength locking monitoring circuit connected to a TO pin disposed at one side of the TO base, and a wavelength locking control circuit connected to the wavelength locking monitoring circuit,
wherein when a forward emitted light emitted by the 10 G-DML is input to the narrowband optical filter through the collimation lens, and a backward emitted light emitted by the 10 G-DML is input to the second MPD, the narrowband optical filter splits the forward emitted light into a forward transmitted light and a backward reflected light, transmits, at a preset elevation angle, the backward reflected light to the second MPD, and partially reflects the forward transmitted light to the first MPD connected to the narrowband optical filter,
wherein the first MPD is configured to receive and monitor a first optical power of the forward transmitted light, and the second MPD is configured to receive and monitor a second optical power that is after the backward emitted light and the backward reflected light complement each other; and
wherein the wavelength locking monitoring circuit is configured to receive the first optical power and the second optical power by using the TO pin, separately compare detected variations of the first optical power and the second optical power and a variation of a wavelength locking factor K0 with corresponding thresholds, and send a comparison result to the wavelength locking control circuit, to enable the wavelength locking control circuit to adjust, according to the comparison result and by using the TO pin, a temperature of the TEC to perform wavelength alignment, wherein the wavelength locking factor K0 is a ratio of the first optical power to the second optical power or a difference between the first optical power and the second optical power.

* * * * *